(12) United States Patent
Berland et al.

(10) Patent No.: US 9,581,741 B1
(45) Date of Patent: Feb. 28, 2017

(54) INFRARED CONTROL COATING OF THIN FILM DEVICES

(71) Applicant: ITN ENERGY SYSTEMS, INC., Littleton, CO (US)

(72) Inventors: Brian Spencer Berland, Morrison, CO (US); Michael Wayne Stowell, Jr., Loveland, CO (US); Russell Hollingsworth, Arvada, CO (US)

(73) Assignee: ITN ENERGY SYSTEMS, INC., Littleton, CO (US)

( * ) Notice: Subject to any disclaimer, the term of this patent is extended or adjusted under 35 U.S.C. 154(b) by 327 days.

(21) Appl. No.: 14/293,934

(22) Filed: Jun. 2, 2014

Related U.S. Application Data

(60) Provisional application No. 61/829,807, filed on May 31, 2013.

(51) Int. Cl.
*G02B 5/28* (2006.01)
*C23C 16/511* (2006.01)
*C23C 16/40* (2006.01)
*C23C 14/34* (2006.01)

(52) U.S. Cl.
CPC .............. *G02B 5/282* (2013.01); *C23C 14/34* (2013.01); *C23C 16/407* (2013.01); *C23C 16/511* (2013.01); *G02B 5/285* (2013.01)

(58) Field of Classification Search
CPC ... G02B 5/20; G02B 5/26; G02B 5/28–5/282; G02B 5/285–5/286
USPC ................. 359/350, 359, 577, 580, 589–590
See application file for complete search history.

(56) References Cited

U.S. PATENT DOCUMENTS

| | | | | |
|---|---|---|---|---|
| 4,970,435 A | * | 11/1990 | Tanaka | H01J 37/32357 118/50.1 |
| 5,804,466 A | * | 9/1998 | Arao | C25D 5/10 136/256 |
| 6,107,116 A | * | 8/2000 | Kariya | H01L 31/075 204/192.12 |
| 6,392,387 B1 | | 5/2002 | Sage et al. | |
| 6,515,787 B1 | | 2/2003 | Westfall et al. | |
| 6,613,393 B1 | * | 9/2003 | Rauschnabel | B05D 1/62 204/192.12 |
| 6,822,778 B2 | | 11/2004 | Westfall et al. | |
| 6,844,976 B1 | * | 1/2005 | Firon | C03C 17/3417 359/577 |
| 6,856,444 B2 | | 2/2005 | Ingalls et al. | |

(Continued)

OTHER PUBLICATIONS

Electric Power Research Institute, Development of Flexible Electrochromic Films, 1018525, Technical Update, Dec. 2009, EPRI Project Manager: K.R. Amarnath, 2009, 42 pgs.

*Primary Examiner* — Derek S Chapel
(74) *Attorney, Agent, or Firm* — George C. Lewis; Merchant & Gould P.C.

(57) ABSTRACT

Systems and methods for creating an infrared-control coated thin film device with certain visible light transmittance and infrared reflectance properties are disclosed. The device may be made using various techniques including physical vapor deposition, chemical vapor deposition, thermal evaporation, pulsed laser deposition, sputter deposition, and sol-gel processes. In particular, a pulsed energy microwave plasma enhanced chemical vapor deposition process may be used. Production of the device may occur at speeds greater than 50 Angstroms/second and temperatures lower than 200° C.

5 Claims, 18 Drawing Sheets

(56) References Cited

U.S. PATENT DOCUMENTS

| | | |
|---|---|---|
| 7,009,750 B1 | 3/2006 | Westfall et al. |
| 7,126,091 B1 | 10/2006 | Westfall et al. |
| 7,133,181 B2 | 11/2006 | Greer |
| 7,145,709 B1 | 12/2006 | Westfall et al. |
| 7,215,457 B1 | 5/2007 | Westfall et al. |
| 7,265,890 B1 | 9/2007 | Demiryont et al. |
| 7,265,891 B1 | 9/2007 | Demiryont et al. |
| 7,277,215 B2 | 10/2007 | Greer |
| 7,372,610 B2 | 5/2008 | Burdis et al. |
| 7,531,239 B2 | 5/2009 | Demiryont |
| 7,586,667 B2 | 9/2009 | Demiryont |
| 7,593,154 B2 | 9/2009 | Burdis et al. |
| 7,619,804 B1 | 11/2009 | Demiryont |
| 7,704,555 B2 | 4/2010 | Demiryont |
| 7,830,585 B2 | 11/2010 | Widjaja et al. |
| 8,025,957 B2 * | 9/2011 | Thiel ................. B32B 17/10036 359/360 |

* cited by examiner

INFRARED CONTROL COATING OF THIN FILM DEVICES

RELATED APPLICATION

This application claims priority to, and the benefit of, U.S. Provisional Patent Application No. 61/829,807 filed May 31, 2013, the disclosure of which is hereby incorporated by reference herein in its entirety.

GOVERNMENT LICENSE RIGHTS

This invention was made with government support under grant # DE-EE0006348 awarded by the Department of Energy.

INTRODUCTION

Thin films are used in a variety of applications. For example, thins films are used in window assemblies. The window assembly has a window pane, and thin films can be deposited onto the window pane. Additionally, a thin film may be deposited on a thin substrate that can then be adhered to the window surface or applied to an insert that is then inserted into a window assembly.

Depending on the type of film used and the material of the window pane, depositing or inserting thin films on window panes can alter certain properties of the window pane. For example, thin films alter the transmittance of light through the window pane. A thin film may reduce the amount of visible light that passes through the window pane. Additionally, certain thin films reduce the amount of infrared light that passes through the window pane.

For certain applications, it is desirous to control the transmittance of specific wavelengths of electromagnetic radiation through a window pane. For example, a window assembly may be used as part of a structure that forms an internal space. As such, it may be desirous to control the temperature of the internal space. Additionally, it may also be desirous to allow people to see through the window. Using a thin film that reduces the amount of infrared light that passes through the window would reduce the total energy entering or exiting the internal space. Consequently, less energy would be required to keep the space at the desired temperature than if all infrared light were allowed to pass through the window. Furthermore, it may also be desirous to allow more transmittance of visible light through the window pane because doing so would allow people to see through the window easier than if the transmittance was low.

Thus, a thin film that could decrease the amount of infrared light that passed through the window pane while still allowing a significant amount of visible light is useful for certain applications.

It is with respect to these and other considerations that embodiments have been disclosed. Also, although relatively specific problems have been discussed, it should be understood that the embodiments should not be limited to solving the specific problems identified in the introduction.

Various embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope of the embodiments to those skilled in the art. Embodiments may be practiced as methods, systems or devices. The following detailed description is, therefore, not to be taken in a limiting sense.

Infrared Control Coating of Thin Film Devices

Systems and methods for creating an infrared-control coated thin film device with certain visible light transmittance and infrared reflectance properties are disclosed. The device may be made using various techniques including physical vapor deposition, chemical vapor deposition, thermal evaporation, pulsed laser deposition, sputter deposition, and sol-gel processes. In particular, a pulsed energy microwave plasma enhanced chemical vapor deposition process may be used. Production of the device may occur at static deposition rates greater than 50 Angstroms/second and substrate temperatures lower than 200° C.

{Claim Summary Section. Completed after Approval of Final Version Claims}

These and various other features as well as advantages which characterize the systems and methods described herein will be apparent from a reading of the following detailed description and a review of the associated drawings. Additional features are set forth in the description which follows, and in part will be apparent from the description, or may be learned by practice of the technology. The benefits and features of the technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Non-limiting and non-exhaustive embodiments are described with reference to the following figures.

It is to be understood that both the foregoing general description and the following detailed description are exemplary and explanatory and are intended to provide further explanation of the invention as claimed.

DETAILED DESCRIPTION

Figure 1:
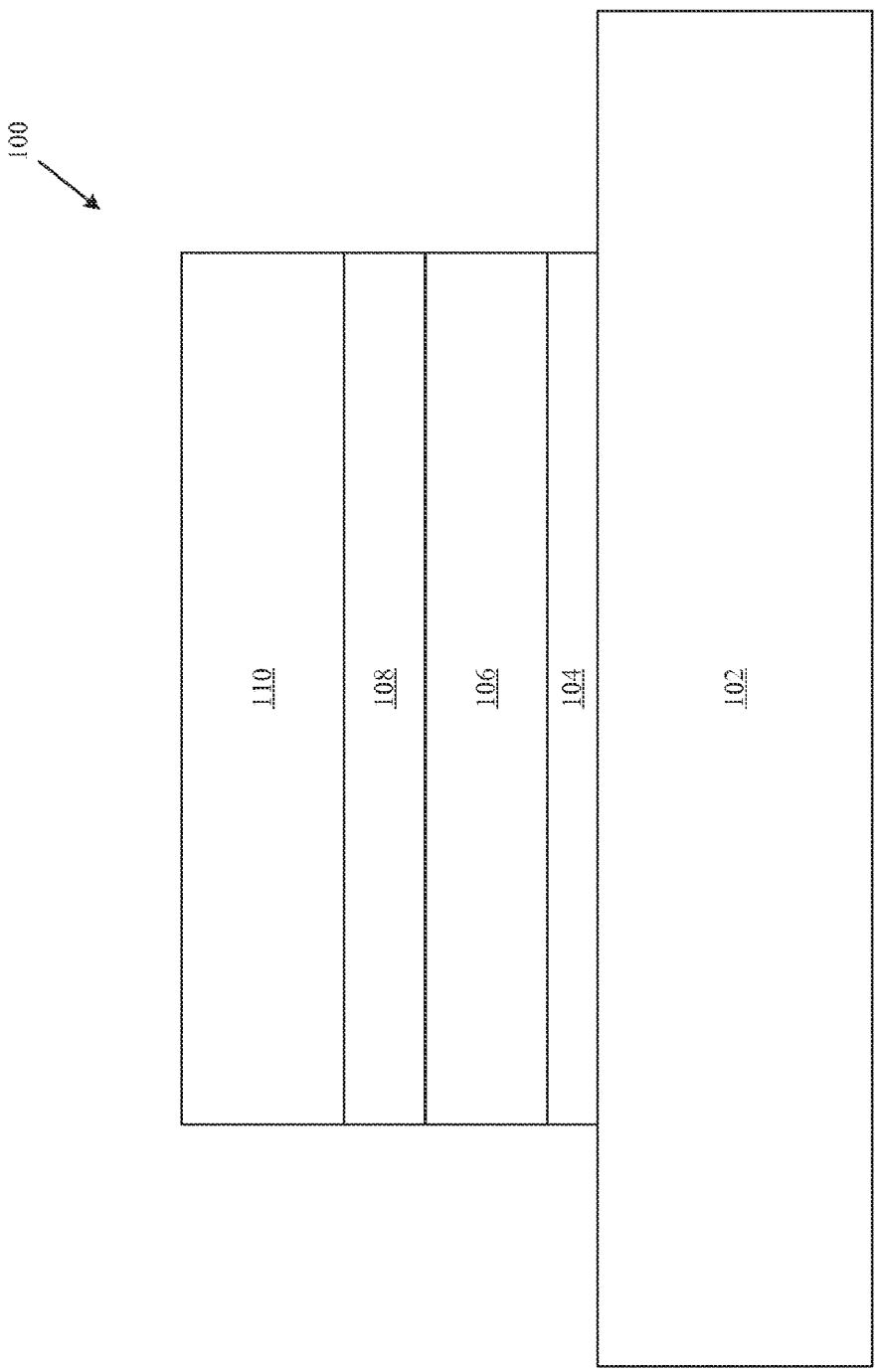
FIG. 1 illustrates an example of a multilayered infrared-control coated thin film device.

Various embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope of the embodiments to those skilled in the art. Embodiments may be practiced as methods, systems or devices. The following detailed description is, therefore, not to be taken in a limiting sense.

Systems and method for producing infrared control coating on thin film devices are disclosed herein. Production of such devices may occur at a relatively low temperature and a relatively high speed. Though the materials are discussed with specificity, it will be appreciated that that various materials may be used in conjunction with the technology disclosed herein is not so limited. The systems and methods described herein may be used to create thin films that are amorphous, polycrystalline, nanocrystalline, nanocrystalline in an amorphous matrix, or ultra-nanocrystalline in an amorphous matrix. Such a matrix may provide a balance between infrared modulation and high visible transmission that may complement the response of the infrared reflection.

The technology described herein may be used in a variety of applications. For example, the technology may be deposited directly onto a window glass pane before integration into a window, deposited onto a stand-alone film that can be adhered directly to a window surface, or deposited onto a stand alone film that can be adhered to a thin plastic or glass substrate and later inserted into a window. The infrared control film may also be used in conjunction with an electrochromic device or other dynamic window system to provide a combination of active and passive control of heat flow through the window system.

Any actively controlled dynamic window glazing, such as an electrochromic device or motorized shading system, may be used in conjunction with a multilayered infrared-control coated thin film device, such as a dielectric stack, that is designed to control the infrared transmittance and reflectance. Further, the infrared-control coatings may be deposited on the same substrate as an electrochromic device, a window pane, an insert, or another substrate. Both the infrared control coating and the electrochromic device may adhere to an insert that fits between two panes of a window assembly or fits into the window well of an existing window. Alternatively, one or both panes may be coated with the thin film. The use of such coating may reduce infrared transmission while still maintaining high transparency with respect to the visible range of light. For example, the average transmittance of the visible light range (i.e., 400-730 nm) may be greater than 90% transparency while maintaining an average reflectance of solar infrared spectrum (i.e., 750-2500 nm) of greater than 70%. It should be noted that achieving other average transmittance and reflectance percentage rates at particular range of wavelengths may be desirous, e.g., any percentage between 0 and 100%.

Unless otherwise specified, the term visible light spectrum refers to the spectrum of light that is detectable by the human eye. For the purposes of this document, the visible spectrum is from about 400 to 730 nanometers (nm) in wavelength. Additionally, unless otherwise specified, the term infrared spectrum refers to the spectrum of light that is longer than those of visible light. Unless otherwise stated, the infrared region will refer to two discrete regions. First, the solar infrared from ~750-2500 nm and the thermal infrared at wavelengths 2500-50,000 nm. The infrared control coating described herein may control one or both of these regions by varying the materials choices, thickness, and deposition technique.

FIG. 1 illustrates an example of an infrared-control coated thin film device 100. As illustrated, the infrared-control coated thin film device 100 includes a substrate 102, a first layer 104, a second layer 106, and a third layer 108, and a fourth layer 110. In other embodiments, more or less layers may be present.

The substrate 102 is a transparent thin foil upon which other layers are deposited. In an embodiment, these layers are inorganic dielectric layers. The substrate 102 may be flexible or rigid. For example, the substrate 102 may be a material with a relatively low melting point compared to glass. In an embodiment, the substrate 102 is one of polyethylene terephthalate ("PET"), polyethylene napthalate (PEN), polycarbonate, transparent polymides, etc. In other embodiments, the substrate 102 may be a transparent organic polymer or a transparent inorganic polymer. Still in other embodiments, the substrate 102 is a ceramic or glass.

One or more layers of materials may be deposited onto the substrate 102. Deposition of infrared-control layers will alter the transmittance and reflectance properties of the resulting infrared-control coated thin film device. Transmittance and reflectance properties are controlled through controlling layer material type, layer thickness, and layer quality.

Materials that may be deposited on a substrate include any transparent conductive oxide. Example transparent conductive oxides include gallium doped zinc oxide ("GZO"), indium tin oxide ("ITO"), Other materials include dielectric layers. Example dielectric materials are silicon dioxide ("SiO2"), titanium dioxide ("TiO2"), Alumina ("Al2O3"), and zinc oxide ("ZnO"). Other materials such as metals, may be used including silver (Ag) and gold (Au).

Each layer may be of a different material. Additionally, the same material may be used for multiple layers. For example, in one embodiment, the first layer 104 is GZO, the second layer 106 is SiO2, the third layer 108 is TiO2, and the fourth layer 110 is SiO2. In another embodiment, there are more than four layers deposited onto a substrate 102. For example, a device may include layers of material in the following order: GZO, SiO2, TiO2, SiO2, TiO2, and SiO2. Layers may also include alloys of materials. Mixing materials together may help achieve a refractive index that is not easily achieved with a pure material.

Layer thickness may vary. Additionally, each layer may be of varying thickness relative to other layers. As illustrated, first layer 104 is thinner than third layer 108, which is thinner than second layer 106, which is thinner than forth layer 110. It will be appreciated that the FIG. 1 is not intended to be a to-scale illustration. In other embodiments, each layer is roughly the same size. In an embodiment, the first layer 104, the second layer 106, the third layer 108, and the fourth layer 110 may have a thickness that ranges from 40 nm to 400 nano-meters.

Layer quality may be controlled by controlling process parameters during deposition of the material. Process parameters include temperature and pressure of a process chamber, and ion energy of plasma. For example, ion energy may be controlled during deposition processes such as sputtering deposition or microwave-enhanced chemical vapor deposition. Controlling the energy of the ions allows a layer, such as first layer 104, to be deposited without or with very few interstitial voids while allowing proper film growth. This occurs because the energy of the ions affects the energy of deposition material as it strikes the substrate 102. Material striking a substrate 102 with too high energy may disrupt the structure of material previously deposited onto the substrate 102, thereby creating void spaces in the layer. Material having too low of energy may fail to form proper lattice structures. This will affect the properties of the deposited layer and ultimately the transmittance and reflectance properties of the device itself. One way to control ion material is through pulsed-chemical vapor deposition, which is discussed in more detail with reference to FIG. 7, below.

The device 100 will have certain reflectance and transmittance properties that are affected by the quality and materials of layers, such as first layer 104, second layer 106, third layer 108, and fourth layer 110. Using the technology described herein, embodiments of infrared-control coated thin film devices have been created having particularly advantageous transmittance and reflectance properties.

For the purpose of this discussion, and particularly with reference to FIGS. 2 through 5, the percent reflectance is defined as the percentage of light at a particular wavelength that is reflected from the thin film device.

Certain layers in the infrared control coating may be deposited using pulsed-energy controlled microwave plasma enhanced chemical vapor deposition. In an embodiment, the film is grown from liquid precursors with substantial vapor pressure such as hexamethyldisiloxane (HMDSO), diethyl zinc (DEZ), trimethyl aluminum (TMA), etc. and gases such as argon or oxygen. The liquid precursors and oxygen are fed into a deposition zone to achieve a total pressure from 10-400 mTorr. A plasma is generated with a linear microwave source which can partially dissociate the precursors enhancing their chemical reactivity and facilitating film growth on the substrate. The film growth may be further aided by increasing the temperature of the substrate.

Average transmittance and reflectance are described with reference to particular ranges of the electromagnetic spectrum.

In an embodiment of the infrared-control coated thin film device, the average transmittance of light in the range of about 400 to 730 nm is greater than 90% while maintaining an average reflectance of light from 700 nm to 2500 nm of greater than 48%. In another embodiment, the average transmittance is greater 90% while the reflectance is greater than 50%. In another embodiment, the average transmittance is greater than 95% while the reflectance is greater than 55%.

Figure 2:
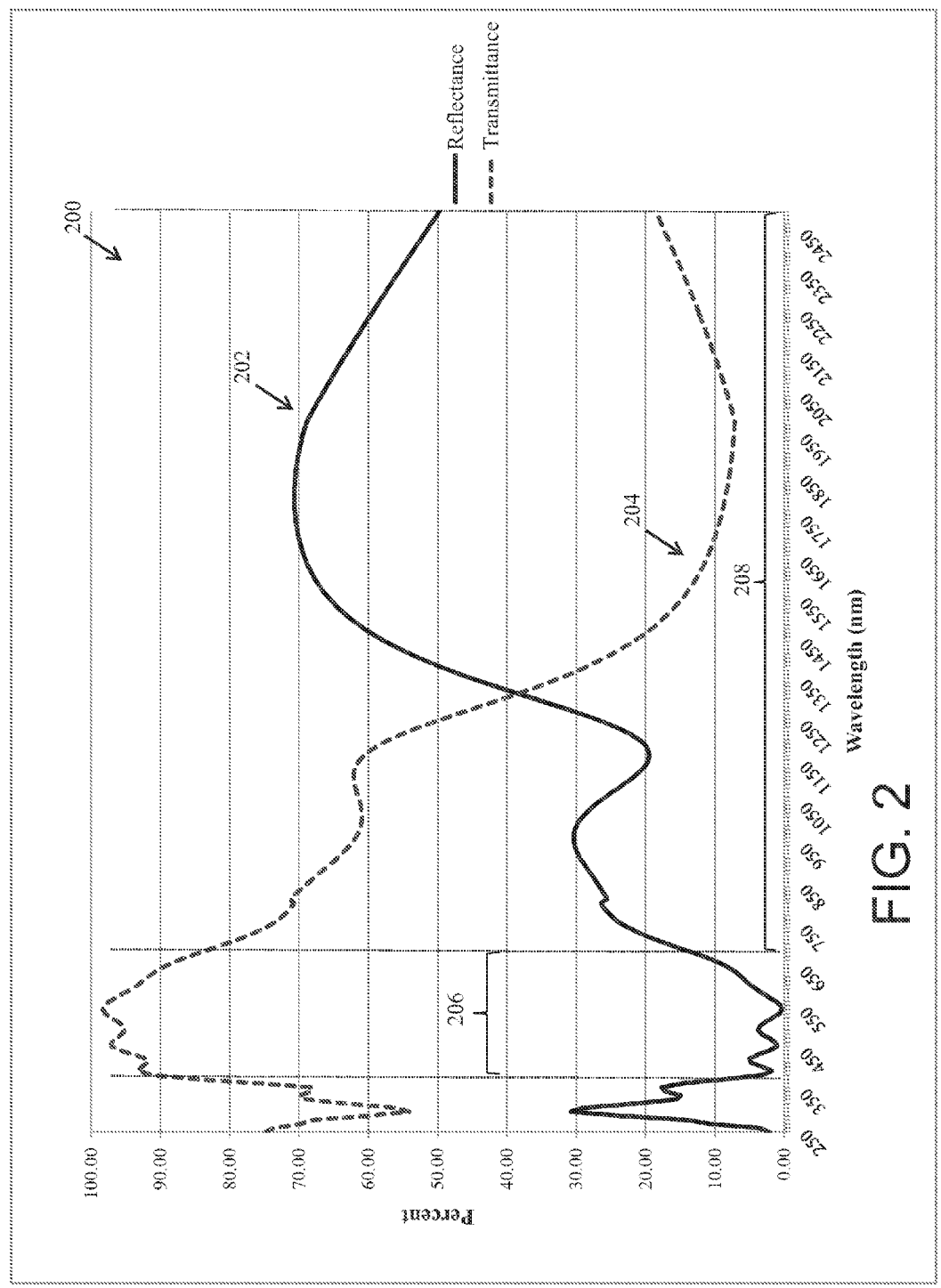
FIG. 2 is a graphical representation of modeled transmittance and reflectance properties of a 4-layer thin film device.

FIGS. 2 through 5 are graphical representations of the modeled reflectance and transmittance properties of dielectric thin film devices that may be created using the methods described herein. FIG. 2 is a graph 200 of the modeled reflectance and transmittance for a dielectric thin film device with PET as the substrate, GZO as a first layer, SiO2 as a second layer, TiO2 as a third layer, and SiO2 as a fourth layer. The graph 200 includes a reflectance line 202 and a transmittance line 204. The visible spectrum 206 is from about 400 nm to about 730 nm. The infrared spectrum 208 illustrated on graph 200 is from about 750 to about 2500 nm. As illustrated, the average transmittance in the visible light range is about 92.12%. Further, the average reflectance in the infrared spectrum is about 50.52%.

Table 1 is a table of the reflectance and transmittance used to generate graph 200.

TABLE 1

| Wavelength (nm) | Reflectance | Transmittance |
|---|---|---|
| 250 | 2.13 | 74.85 |
| 260 | 3.50 | 73.67 |
| 270 | 10.61 | 69.82 |
| 280 | 13.84 | 68.12 |
| 290 | 23.74 | 59.95 |
| 300 | 30.80 | 54.16 |
| 310 | 28.93 | 56.11 |
| 320 | 21.51 | 63.10 |
| 330 | 15.53 | 69.00 |
| 340 | 14.96 | 69.89 |
| 350 | 17.15 | 68.22 |
| 360 | 17.68 | 68.17 |
| 370 | 14.38 | 76.36 |
| 380 | 8.19 | 85.00 |
| 390 | 3.13 | 91.20 |
| 400 | 1.79 | 93.37 |
| 410 | 3.19 | 92.73 |
| 420 | 4.78 | 91.83 |
| 430 | 4.98 | 92.19 |
| 440 | 3.75 | 93.90 |
| 450 | 2.06 | 95.85 |
| 460 | 1.07 | 97.05 |
| 470 | 1.25 | 97.10 |
| 480 | 2.23 | 96.34 |
| 490 | 3.27 | 95.54 |
| 500 | 3.75 | 95.18 |
| 510 | 3.49 | 95.41 |
| 520 | 2.64 | 96.21 |
| 530 | 1.58 | 97.21 |
| 540 | 0.73 | 98.02 |
| 550 | 0.37 | 98.34 |
| 560 | 0.57 | 98.09 |
| 570 | 1.25 | 97.37 |
| 580 | 2.19 | 96.34 |
| 590 | 3.18 | 95.23 |
| 600 | 4.09 | 94.21 |
| 610 | 4.87 | 93.32 |
| 620 | 5.54 | 92.53 |
| 630 | 6.18 | 91.78 |
| 640 | 6.89 | 90.97 |
| 650 | 7.76 | 90.00 |
| 660 | 8.85 | 88.83 |
| 670 | 10.17 | 87.45 |
| 680 | 11.69 | 85.87 |
| 690 | 13.35 | 84.17 |
| 700 | 15.07 | 82.42 |
| 710 | 16.78 | 80.68 |
| 720 | 18.42 | 79.02 |
| 730 | 19.95 | 77.47 |
| 740 | 21.32 | 76.08 |
| 750 | 22.52 | 74.86 |
| 760 | 23.54 | 73.82 |

TABLE 1-continued

| Wavelength (nm) | Reflectance | Transmittance |
|---|---|---|
| 770 | 24.39 | 72.94 |
| 780 | 25.08 | 72.22 |
| 790 | 25.64 | 71.64 |
| 800 | 26.08 | 71.16 |
| 810 | 26.45 | 70.75 |
| 820 | 25.56 | 71.31 |
| 830 | 25.91 | 70.67 |
| 840 | 26.26 | 70.03 |
| 850 | 26.63 | 69.37 |
| 860 | 27.02 | 68.69 |
| 870 | 27.43 | 67.99 |
| 880 | 27.84 | 67.28 |
| 890 | 28.27 | 66.57 |
| 900 | 28.68 | 65.85 |
| 910 | 29.08 | 65.16 |
| 920 | 29.45 | 64.48 |
| 930 | 29.77 | 63.85 |
| 940 | 30.04 | 63.26 |
| 950 | 30.24 | 62.73 |
| 960 | 30.36 | 62.25 |
| 970 | 30.40 | 61.85 |
| 980 | 30.34 | 61.52 |
| 990 | 30.20 | 61.26 |
| 1000 | 29.95 | 61.08 |
| 1010 | 29.61 | 60.97 |
| 1020 | 29.17 | 60.93 |
| 1030 | 28.64 | 60.95 |
| 1040 | 28.03 | 61.03 |
| 1050 | 27.33 | 61.15 |
| 1060 | 26.58 | 61.31 |
| 1070 | 25.77 | 61.48 |
| 1080 | 24.92 | 61.67 |
| 1090 | 24.06 | 61.85 |
| 1100 | 23.21 | 62.00 |
| 1110 | 22.38 | 62.10 |
| 1120 | 21.61 | 62.14 |
| 1130 | 20.92 | 62.09 |
| 1140 | 20.34 | 61.94 |
| 1150 | 19.89 | 61.67 |
| 1160 | 19.59 | 61.26 |
| 1170 | 19.47 | 60.70 |
| 1180 | 19.54 | 60.00 |
| 1190 | 19.82 | 59.13 |
| 1200 | 20.31 | 58.11 |
| 1210 | 21.01 | 56.94 |
| 1220 | 21.91 | 55.63 |
| 1230 | 23.00 | 54.19 |
| 1240 | 24.27 | 52.65 |
| 1250 | 25.69 | 51.02 |
| 1260 | 27.25 | 49.32 |
| 1270 | 28.91 | 47.57 |
| 1280 | 30.66 | 45.79 |
| 1290 | 32.47 | 44.00 |
| 1300 | 34.32 | 42.22 |
| 1310 | 36.18 | 40.46 |
| 1320 | 38.04 | 38.74 |
| 1330 | 39.89 | 37.06 |
| 1340 | 41.70 | 35.43 |
| 1350 | 43.46 | 33.86 |
| 1360 | 45.18 | 32.35 |
| 1370 | 46.83 | 30.91 |
| 1380 | 48.43 | 29.53 |
| 1390 | 49.95 | 28.22 |
| 1400 | 51.40 | 26.98 |
| 1410 | 52.79 | 25.81 |
| 1420 | 54.10 | 24.70 |
| 1430 | 55.34 | 23.65 |
| 1440 | 56.51 | 22.66 |
| 1450 | 57.62 | 21.72 |
| 1460 | 58.66 | 20.84 |
| 1470 | 59.64 | 20.01 |
| 1480 | 60.55 | 19.23 |
| 1490 | 61.41 | 18.50 |
| 1500 | 62.21 | 17.81 |
| 1510 | 62.95 | 17.16 |
| 1520 | 63.65 | 16.54 |
| 1530 | 64.29 | 15.97 |

TABLE 1-continued

| Wavelength (nm) | Reflectance | Transmittance |
|---|---|---|
| 1540 | 64.89 | 15.43 |
| 1550 | 65.45 | 14.92 |
| 1560 | 65.96 | 14.45 |
| 1570 | 66.43 | 14.00 |
| 1580 | 66.87 | 13.58 |
| 1590 | 67.28 | 13.18 |
| 1600 | 67.65 | 12.81 |
| 1610 | 67.99 | 12.46 |
| 1620 | 68.31 | 12.14 |
| 1630 | 68.60 | 11.83 |
| 1640 | 68.86 | 11.53 |
| 1650 | 69.10 | 11.26 |
| 1660 | 69.33 | 11.00 |
| 1670 | 69.53 | 10.75 |
| 1680 | 69.71 | 10.52 |
| 1690 | 69.87 | 10.30 |
| 1700 | 70.02 | 10.09 |
| 1710 | 70.15 | 9.89 |
| 1720 | 70.27 | 9.70 |
| 1730 | 70.37 | 9.53 |
| 1740 | 70.46 | 9.36 |
| 1750 | 70.53 | 9.20 |
| 1760 | 70.59 | 9.05 |
| 1770 | 70.64 | 8.90 |
| 1780 | 70.67 | 8.76 |
| 1790 | 70.69 | 8.63 |
| 1800 | 70.70 | 8.51 |
| 1810 | 70.70 | 8.39 |
| 1820 | 70.69 | 8.28 |
| 1830 | 70.66 | 8.17 |
| 1840 | 70.63 | 8.07 |
| 1850 | 70.58 | 7.98 |
| 1860 | 70.52 | 7.89 |
| 1870 | 70.46 | 7.80 |
| 1880 | 70.38 | 7.72 |
| 1890 | 70.29 | 7.65 |
| 1900 | 70.19 | 7.58 |
| 1910 | 70.08 | 7.51 |
| 1920 | 69.96 | 7.45 |
| 1930 | 69.83 | 7.39 |
| 1940 | 69.69 | 7.34 |
| 1950 | 69.53 | 7.29 |
| 1960 | 69.37 | 7.24 |
| 1970 | 69.20 | 7.20 |
| 1980 | 69.01 | 7.16 |
| 1990 | 68.82 | 7.13 |
| 2000 | 68.49 | 7.30 |
| 2010 | 68.16 | 7.47 |
| 2020 | 67.83 | 7.64 |
| 2030 | 67.50 | 7.81 |
| 2040 | 67.16 | 7.99 |
| 2050 | 66.83 | 8.17 |
| 2060 | 66.49 | 8.35 |
| 2070 | 66.14 | 8.53 |
| 2080 | 65.80 | 8.72 |
| 2090 | 65.45 | 8.91 |
| 2100 | 65.10 | 9.10 |
| 2110 | 64.74 | 9.29 |
| 2120 | 64.39 | 9.49 |
| 2130 | 64.03 | 9.69 |
| 2140 | 63.67 | 9.89 |
| 2150 | 63.31 | 10.09 |
| 2160 | 62.95 | 10.30 |
| 2170 | 62.58 | 10.50 |
| 2180 | 62.21 | 10.72 |
| 2190 | 61.84 | 10.93 |
| 2200 | 61.47 | 11.14 |
| 2210 | 61.10 | 11.36 |
| 2220 | 60.72 | 11.58 |
| 2230 | 60.34 | 11.80 |
| 2240 | 59.97 | 12.03 |
| 2250 | 59.59 | 12.25 |
| 2260 | 59.20 | 12.48 |
| 2270 | 58.82 | 12.71 |
| 2280 | 58.44 | 12.95 |
| 2290 | 58.05 | 13.18 |
| 2300 | 57.67 | 13.42 |

TABLE 1-continued

| Wavelength (nm) | Reflectance | Transmittance |
|---|---|---|
| 2310 | 57.28 | 13.66 |
| 2320 | 56.89 | 13.90 |
| 2330 | 56.50 | 14.14 |
| 2340 | 56.11 | 14.39 |
| 2350 | 55.72 | 14.64 |
| 2360 | 55.32 | 14.88 |
| 2370 | 54.93 | 15.14 |
| 2380 | 54.54 | 15.39 |
| 2390 | 54.14 | 15.64 |
| 2400 | 53.75 | 15.90 |
| 2410 | 53.35 | 16.16 |
| 2420 | 52.95 | 16.42 |
| 2430 | 52.56 | 16.68 |
| 2440 | 52.16 | 16.94 |
| 2450 | 51.76 | 17.21 |
| 2460 | 51.37 | 17.47 |
| 2470 | 50.97 | 17.74 |
| 2480 | 50.57 | 18.01 |
| 2490 | 50.17 | 18.28 |
| 2500 | 49.77 | 18.55 |

Figure 3:
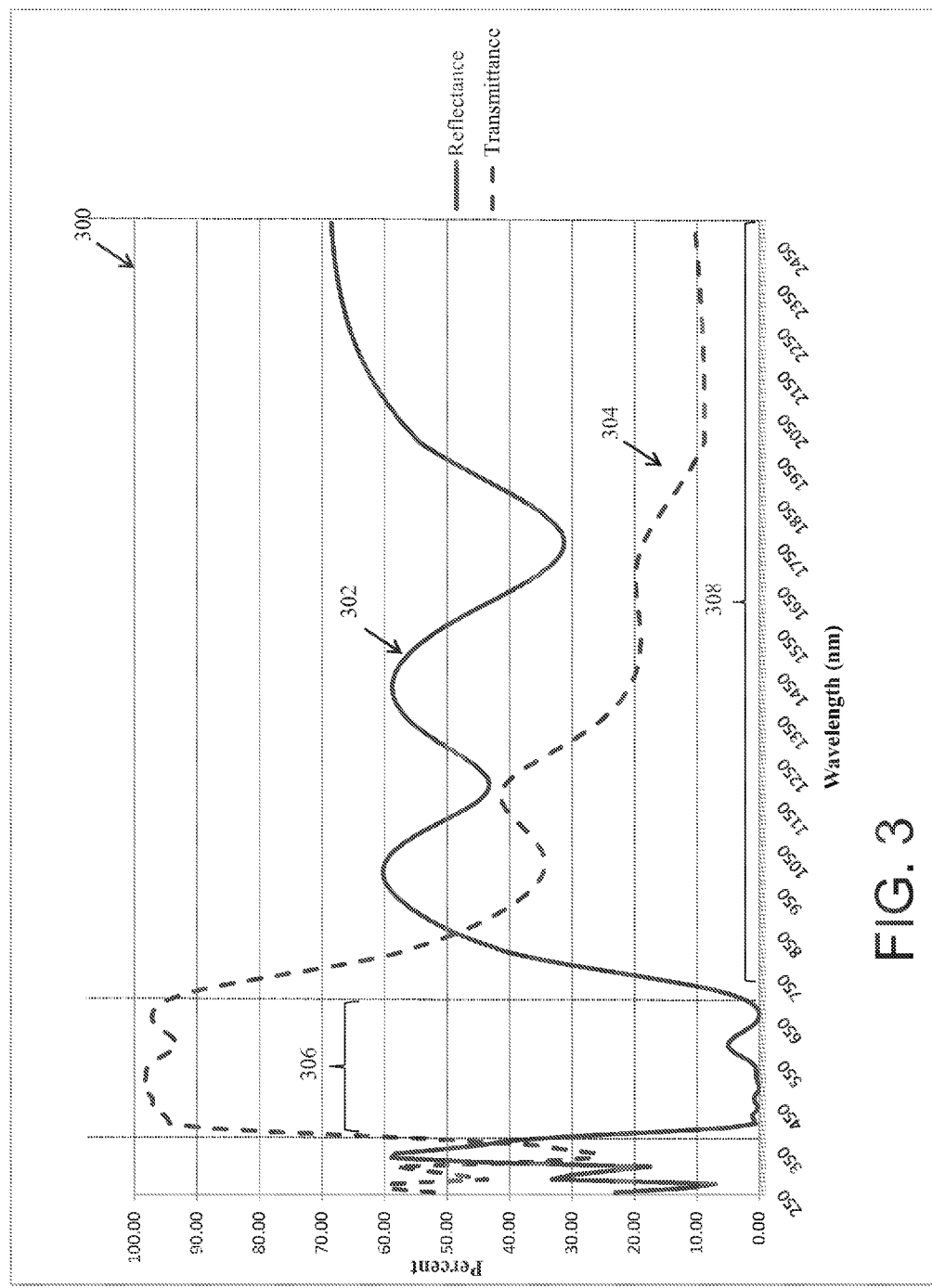
FIG. 3 is a graphical representation of modeled transmittance and reflectance properties of a 6 layer thin film device.

FIG. 3 is a graph 300 of the reflectance and transmittance for a dielectric thin film device with PET as the substrate, SiO2 as a first layer at a thickness of 360.45 nm, TiO2 as a second layer at 106.14 nm, SiO2 as a third layer at a thickness of 168.89 nm, TiO2 as a fourth layer at a thickness of 91.85 nm, and SiO2 as a fifth layer at a thickness of 72.12 nm. The graph 300 includes a reflectance line 302 and a transmittance line 304. The visible spectrum 306 is from about 400 nm to about 730 nm. The infrared spectrum 308 is illustrated on graph 300 from about 750 to about 2500 nm. As illustrated, the average transmittance in the visible light range is about 95.46%. Further, the average reflectance in the infrared spectrum is about 52.31%.

Table 2 is a table of the reflectance and transmittance used to generate graph 300.

TABLE 2

| Wavelength (nm) | Reflectance | Transmittance |
|---|---|---|
| 250 | 23.07 | 52.08 |
| 260 | 11.82 | 59.68 |
| 270 | 7.04 | 59.48 |
| 280 | 33.19 | 43.62 |
| 290 | 30.25 | 48.11 |
| 300 | 24.02 | 53.53 |
| 310 | 17.51 | 58.21 |
| 320 | 43.93 | 37.90 |
| 330 | 58.88 | 26.06 |
| 340 | 58.24 | 25.94 |
| 350 | 50.91 | 31.30 |
| 360 | 44.56 | 35.88 |
| 370 | 40.14 | 47.24 |
| 380 | 30.26 | 61.32 |
| 390 | 16.67 | 76.60 |
| 400 | 5.00 | 89.04 |
| 410 | 0.55 | 94.31 |
| 420 | 1.00 | 94.77 |
| 430 | 1.19 | 95.29 |
| 440 | 0.45 | 96.70 |
| 450 | 0.28 | 97.24 |
| 460 | 0.73 | 97.04 |
| 470 | 0.85 | 97.16 |
| 480 | 0.43 | 97.81 |
| 490 | 0.04 | 98.49 |
| 500 | 0.09 | 98.63 |
| 510 | 0.40 | 98.32 |
| 520 | 0.57 | 98.13 |
| 530 | 0.52 | 98.14 |
| 540 | 0.58 | 98.04 |

TABLE 2-continued

| Wavelength (nm) | Reflectance | Transmittance |
|---|---|---|
| 550 | 1.12 | 97.48 |
| 560 | 2.20 | 96.39 |
| 570 | 3.50 | 95.05 |
| 580 | 4.57 | 93.89 |
| 590 | 5.06 | 93.28 |
| 600 | 4.85 | 93.34 |
| 610 | 4.06 | 93.98 |
| 620 | 2.95 | 94.92 |
| 630 | 1.81 | 95.88 |
| 640 | 0.87 | 96.65 |
| 650 | 0.26 | 97.12 |
| 660 | 0.01 | 97.23 |
| 670 | 0.11 | 97.02 |
| 680 | 0.55 | 96.48 |
| 690 | 1.40 | 95.55 |
| 700 | 2.75 | 94.15 |
| 710 | 4.71 | 92.16 |
| 720 | 7.33 | 89.54 |
| 730 | 10.59 | 86.32 |
| 740 | 14.38 | 82.59 |
| 750 | 18.53 | 78.53 |
| 760 | 22.81 | 74.35 |
| 770 | 27.03 | 70.22 |
| 780 | 31.04 | 66.32 |
| 790 | 34.73 | 62.73 |
| 800 | 38.04 | 59.50 |
| 810 | 40.99 | 56.63 |
| 820 | 42.65 | 54.78 |
| 830 | 44.76 | 52.53 |
| 840 | 46.64 | 50.50 |
| 850 | 48.32 | 48.68 |
| 860 | 49.84 | 47.02 |
| 870 | 51.23 | 45.49 |
| 880 | 52.51 | 44.08 |
| 890 | 53.70 | 42.76 |
| 900 | 54.80 | 41.52 |
| 910 | 55.82 | 40.37 |
| 920 | 56.75 | 39.30 |
| 930 | 57.59 | 38.33 |
| 940 | 58.33 | 37.44 |
| 950 | 58.96 | 36.66 |
| 960 | 59.47 | 35.98 |
| 970 | 59.86 | 35.42 |
| 980 | 60.11 | 34.97 |
| 990 | 60.23 | 34.64 |
| 1000 | 60.21 | 34.42 |
| 1010 | 60.03 | 34.33 |
| 1020 | 59.71 | 34.36 |
| 1030 | 59.24 | 34.50 |
| 1040 | 58.63 | 34.75 |
| 1050 | 57.87 | 35.11 |
| 1060 | 56.97 | 35.56 |
| 1070 | 55.94 | 36.10 |
| 1080 | 54.80 | 36.71 |
| 1090 | 53.57 | 37.37 |
| 1100 | 52.26 | 38.06 |
| 1110 | 50.91 | 38.76 |
| 1120 | 49.55 | 39.44 |
| 1130 | 48.22 | 40.06 |
| 1140 | 46.97 | 40.59 |
| 1150 | 45.84 | 41.01 |
| 1160 | 44.88 | 41.27 |
| 1170 | 44.11 | 41.37 |
| 1180 | 43.58 | 41.27 |
| 1190 | 43.29 | 40.98 |
| 1200 | 43.27 | 40.49 |
| 1210 | 43.49 | 39.82 |
| 1220 | 43.94 | 38.98 |
| 1230 | 44.60 | 38.02 |
| 1240 | 45.42 | 36.94 |
| 1250 | 46.38 | 35.79 |
| 1260 | 47.43 | 34.60 |
| 1270 | 48.53 | 33.38 |
| 1280 | 49.66 | 32.17 |
| 1290 | 50.78 | 30.99 |
| 1300 | 51.87 | 29.84 |
| 1310 | 52.90 | 28.75 |

TABLE 2-continued

| Wavelength (nm) | Reflectance | Transmittance |
|---|---|---|
| 1320 | 53.88 | 27.71 |
| 1330 | 54.78 | 26.74 |
| 1340 | 55.59 | 25.84 |
| 1350 | 56.32 | 25.00 |
| 1360 | 56.95 | 24.23 |
| 1370 | 57.49 | 23.52 |
| 1380 | 57.93 | 22.88 |
| 1390 | 58.27 | 22.30 |
| 1400 | 58.53 | 21.78 |
| 1410 | 58.69 | 21.31 |
| 1420 | 58.75 | 20.90 |
| 1430 | 58.73 | 20.53 |
| 1440 | 58.61 | 20.22 |
| 1450 | 58.41 | 19.94 |
| 1460 | 58.12 | 19.71 |
| 1470 | 57.74 | 19.51 |
| 1480 | 57.28 | 19.35 |
| 1490 | 56.73 | 19.22 |
| 1500 | 56.10 | 19.13 |
| 1510 | 55.38 | 19.06 |
| 1520 | 54.59 | 19.02 |
| 1530 | 53.72 | 19.00 |
| 1540 | 52.77 | 19.01 |
| 1550 | 51.75 | 19.04 |
| 1560 | 50.67 | 19.09 |
| 1570 | 49.53 | 19.15 |
| 1580 | 48.33 | 19.22 |
| 1590 | 47.09 | 19.30 |
| 1600 | 45.81 | 19.39 |
| 1610 | 44.51 | 19.48 |
| 1620 | 43.19 | 19.56 |
| 1630 | 41.87 | 19.64 |
| 1640 | 40.56 | 19.71 |
| 1650 | 39.27 | 19.77 |
| 1660 | 38.03 | 19.81 |
| 1670 | 36.85 | 19.82 |
| 1680 | 35.74 | 19.81 |
| 1690 | 34.73 | 19.77 |
| 1700 | 33.81 | 19.70 |
| 1710 | 33.02 | 19.59 |
| 1720 | 32.37 | 19.45 |
| 1730 | 31.86 | 19.26 |
| 1740 | 31.50 | 19.04 |
| 1750 | 31.30 | 18.78 |
| 1760 | 31.26 | 18.48 |
| 1770 | 31.38 | 18.15 |
| 1780 | 31.65 | 17.79 |
| 1790 | 32.08 | 17.39 |
| 1800 | 32.66 | 16.98 |
| 1810 | 33.36 | 16.54 |
| 1820 | 34.19 | 16.08 |
| 1830 | 35.12 | 15.61 |
| 1840 | 36.15 | 15.13 |
| 1850 | 37.25 | 14.65 |
| 1860 | 38.42 | 14.16 |
| 1870 | 39.64 | 13.68 |
| 1880 | 40.90 | 13.20 |
| 1890 | 42.18 | 12.73 |
| 1900 | 43.47 | 12.27 |
| 1910 | 44.76 | 11.83 |
| 1920 | 46.05 | 11.39 |
| 1930 | 47.33 | 10.98 |
| 1940 | 48.58 | 10.57 |
| 1950 | 49.81 | 10.19 |
| 1960 | 51.00 | 9.82 |
| 1970 | 52.16 | 9.47 |
| 1980 | 53.29 | 9.13 |
| 1990 | 54.37 | 8.81 |
| 2000 | 55.01 | 8.81 |
| 2010 | 55.63 | 8.81 |
| 2020 | 56.24 | 8.81 |
| 2030 | 56.83 | 8.81 |
| 2040 | 57.40 | 8.81 |
| 2050 | 57.95 | 8.81 |
| 2060 | 58.48 | 8.81 |
| 2070 | 59.00 | 8.82 |
| 2080 | 59.49 | 8.82 |
| 2090 | 59.97 | 8.83 |
| 2100 | 60.43 | 8.84 |
| 2110 | 60.87 | 8.85 |
| 2120 | 61.30 | 8.86 |
| 2130 | 61.70 | 8.87 |
| 2140 | 62.10 | 8.88 |
| 2150 | 62.47 | 8.90 |
| 2160 | 62.83 | 8.91 |
| 2170 | 63.18 | 8.93 |
| 2180 | 63.51 | 8.95 |
| 2190 | 63.83 | 8.97 |
| 2200 | 64.13 | 8.99 |
| 2210 | 64.42 | 9.02 |
| 2220 | 64.69 | 9.04 |
| 2230 | 64.96 | 9.07 |
| 2240 | 65.21 | 9.10 |
| 2250 | 65.45 | 9.13 |
| 2260 | 65.68 | 9.16 |
| 2270 | 65.89 | 9.20 |
| 2280 | 66.10 | 9.23 |
| 2290 | 66.30 | 9.27 |
| 2300 | 66.48 | 9.31 |
| 2310 | 66.66 | 9.35 |
| 2320 | 66.82 | 9.39 |
| 2330 | 66.98 | 9.43 |
| 2340 | 67.13 | 9.48 |
| 2350 | 67.27 | 9.53 |
| 2360 | 67.40 | 9.57 |
| 2370 | 67.52 | 9.62 |
| 2380 | 67.64 | 9.67 |
| 2390 | 67.74 | 9.73 |
| 2400 | 67.84 | 9.78 |
| 2410 | 67.94 | 9.84 |
| 2420 | 68.02 | 9.89 |
| 2430 | 68.10 | 9.95 |
| 2440 | 68.17 | 10.01 |
| 2450 | 68.24 | 10.07 |
| 2460 | 68.30 | 10.13 |
| 2470 | 68.35 | 10.20 |
| 2480 | 68.40 | 10.26 |
| 2490 | 68.44 | 10.33 |
| 2500 | 68.48 | 10.40 |

Figure 4:
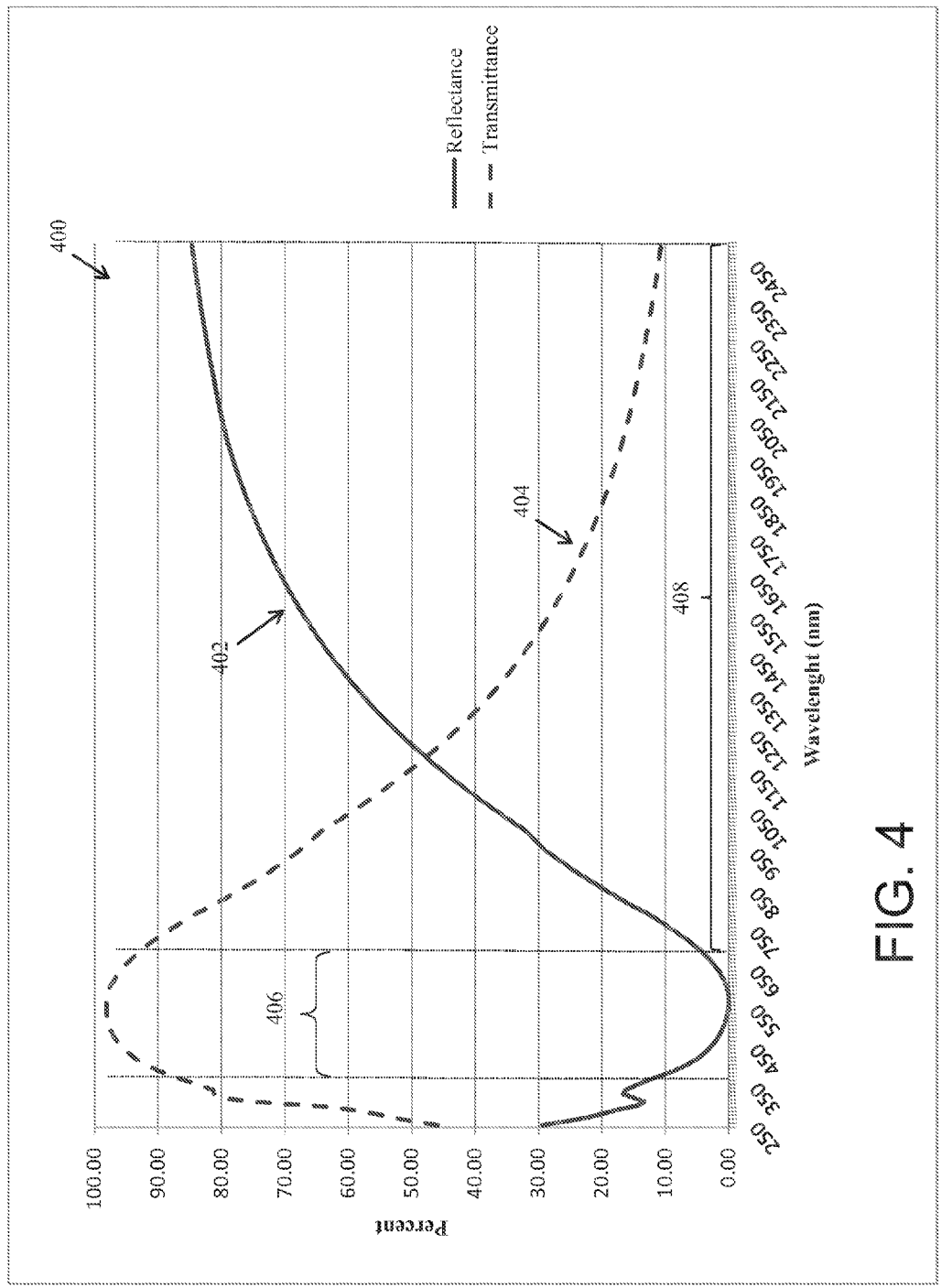
FIG. 4 is a graphical representation of modeled transmittance and reflectance properties of a three layer thin film device.

FIG. 4 is a graph 400 of the reflectance and transmittance for a dielectric thin film device with PET as the substrate, ZnO as a first layer at a thickness of 48.86 nm, Ag as a second layer at a thickness of 9 nm, and ZnO as a third layer at a thickness of 44.08 nm. The graph 300 includes a reflectance line 402 and a transmittance line 404. The visible spectrum 406 is from about 400 nm to about 730 nm. The infrared spectrum 408 is illustrated on graph 400 from about 750 to about 2500 nm. As illustrated, the average transmittance in the visible light range is about 95.62%. Further, the average reflectance in the infrared spectrum is about 61.75%.

Table 3 is a table of the reflectance and transmittance used to generate graph 400.

TABLE 3

| Wavelength (nm) | Reflectance | Transmittance |
|---|---|---|
| 250 | 29.36 | 45.88 |
| 260 | 25.58 | 49.84 |
| 270 | 22.08 | 53.22 |
| 280 | 19.67 | 56.04 |
| 290 | 17.34 | 59.84 |
| 300 | 14.33 | 65.64 |
| 310 | 13.34 | 75.33 |
| 320 | 14.92 | 80.20 |
| 330 | 16.65 | 81.12 |

TABLE 3-continued

| Wavelength (nm) | Reflectance | Transmittance |
|---|---|---|
| 340 | 16.25 | 81.37 |
| 350 | 14.88 | 83.06 |
| 360 | 13.38 | 84.92 |
| 370 | 11.88 | 86.88 |
| 380 | 10.04 | 88.59 |
| 390 | 8.45 | 90.04 |
| 400 | 7.05 | 91.30 |
| 410 | 5.91 | 92.47 |
| 420 | 4.94 | 93.48 |
| 430 | 4.12 | 94.36 |
| 440 | 3.43 | 95.10 |
| 450 | 2.85 | 95.75 |
| 460 | 2.29 | 96.28 |
| 470 | 1.84 | 96.72 |
| 480 | 1.46 | 97.09 |
| 490 | 1.14 | 97.40 |
| 500 | 0.86 | 97.66 |
| 510 | 0.63 | 97.83 |
| 520 | 0.43 | 97.96 |
| 530 | 0.26 | 98.06 |
| 540 | 0.14 | 98.12 |
| 550 | 0.05 | 98.13 |
| 560 | 0.01 | 98.11 |
| 570 | 0.00 | 98.05 |
| 580 | 0.05 | 97.95 |
| 590 | 0.13 | 97.80 |
| 600 | 0.26 | 97.61 |
| 610 | 0.46 | 97.31 |
| 620 | 0.71 | 96.96 |
| 630 | 1.02 | 96.56 |
| 640 | 1.39 | 96.09 |
| 650 | 1.82 | 95.56 |
| 660 | 2.28 | 95.05 |
| 670 | 2.79 | 94.49 |
| 680 | 3.37 | 93.87 |
| 690 | 4.00 | 93.18 |
| 700 | 4.69 | 92.45 |
| 710 | 5.44 | 91.66 |
| 720 | 6.24 | 90.82 |
| 730 | 7.08 | 89.95 |
| 740 | 7.97 | 89.02 |
| 750 | 8.90 | 88.07 |
| 760 | 9.81 | 87.09 |
| 770 | 10.75 | 86.09 |
| 780 | 11.72 | 85.07 |
| 790 | 12.70 | 84.03 |
| 800 | 13.95 | 82.75 |
| 810 | 15.17 | 81.48 |
| 820 | 16.22 | 80.39 |
| 830 | 17.27 | 79.30 |
| 840 | 18.34 | 78.20 |
| 850 | 19.39 | 77.10 |
| 860 | 20.37 | 76.12 |
| 870 | 21.36 | 75.13 |
| 880 | 22.34 | 74.15 |
| 890 | 23.34 | 73.16 |
| 900 | 24.34 | 72.16 |
| 910 | 25.21 | 71.29 |
| 920 | 26.09 | 70.41 |
| 930 | 26.98 | 69.53 |
| 940 | 27.86 | 68.66 |
| 950 | 28.73 | 67.79 |
| 960 | 29.35 | 67.09 |
| 970 | 29.98 | 66.39 |
| 980 | 30.59 | 65.70 |
| 990 | 31.18 | 65.03 |
| 1000 | 31.78 | 64.36 |
| 1010 | 32.71 | 63.37 |
| 1020 | 33.65 | 62.38 |
| 1030 | 34.57 | 61.41 |
| 1040 | 35.47 | 60.47 |
| 1050 | 36.36 | 59.53 |
| 1060 | 37.24 | 58.61 |
| 1070 | 38.13 | 57.67 |
| 1080 | 39.01 | 56.76 |
| 1090 | 39.85 | 55.88 |
| 1100 | 40.69 | 55.00 |
| 1110 | 41.52 | 54.14 |
| 1120 | 42.35 | 53.29 |
| 1130 | 43.15 | 52.46 |
| 1140 | 43.94 | 51.64 |
| 1150 | 44.71 | 50.84 |
| 1160 | 45.48 | 50.05 |
| 1170 | 46.24 | 49.27 |
| 1180 | 46.98 | 48.50 |
| 1190 | 47.71 | 47.75 |
| 1200 | 48.43 | 47.02 |
| 1210 | 49.14 | 46.29 |
| 1220 | 49.83 | 45.58 |
| 1230 | 50.52 | 44.89 |
| 1240 | 51.19 | 44.20 |
| 1250 | 51.85 | 43.53 |
| 1260 | 52.49 | 42.87 |
| 1270 | 53.13 | 42.22 |
| 1280 | 53.76 | 41.59 |
| 1290 | 54.37 | 40.97 |
| 1300 | 54.98 | 40.36 |
| 1310 | 55.56 | 39.77 |
| 1320 | 56.13 | 39.19 |
| 1330 | 56.69 | 38.62 |
| 1340 | 57.24 | 38.07 |
| 1350 | 57.79 | 37.52 |
| 1360 | 58.33 | 36.98 |
| 1370 | 58.85 | 36.45 |
| 1380 | 59.36 | 35.93 |
| 1390 | 59.87 | 35.43 |
| 1400 | 60.37 | 34.93 |
| 1410 | 60.86 | 34.44 |
| 1420 | 61.35 | 33.95 |
| 1430 | 61.82 | 33.48 |
| 1440 | 62.28 | 33.02 |
| 1450 | 62.74 | 32.56 |
| 1460 | 63.19 | 32.11 |
| 1470 | 63.63 | 31.67 |
| 1480 | 64.07 | 31.24 |
| 1490 | 64.50 | 30.82 |
| 1500 | 64.92 | 30.41 |
| 1510 | 65.33 | 30.00 |
| 1520 | 65.74 | 29.60 |
| 1530 | 66.14 | 29.20 |
| 1540 | 66.53 | 28.81 |
| 1550 | 66.91 | 28.44 |
| 1560 | 67.29 | 28.07 |
| 1570 | 67.67 | 27.70 |
| 1580 | 68.03 | 27.34 |
| 1590 | 68.39 | 26.99 |
| 1600 | 68.75 | 26.64 |
| 1610 | 69.10 | 26.30 |
| 1620 | 69.44 | 25.96 |
| 1630 | 69.78 | 25.64 |
| 1640 | 70.11 | 25.31 |
| 1650 | 70.44 | 25.00 |
| 1660 | 70.76 | 24.68 |
| 1670 | 71.07 | 24.38 |
| 1680 | 71.38 | 24.07 |
| 1690 | 71.69 | 23.78 |
| 1700 | 71.99 | 23.49 |
| 1710 | 72.29 | 23.20 |
| 1720 | 72.58 | 22.92 |
| 1730 | 72.86 | 22.65 |
| 1740 | 73.14 | 22.38 |
| 1750 | 73.42 | 22.11 |
| 1760 | 73.69 | 21.85 |
| 1770 | 73.96 | 21.59 |
| 1780 | 74.23 | 21.33 |
| 1790 | 74.49 | 21.08 |
| 1800 | 74.74 | 20.84 |
| 1810 | 75.00 | 20.60 |
| 1820 | 75.25 | 20.35 |
| 1830 | 75.49 | 20.12 |
| 1840 | 75.73 | 19.90 |
| 1850 | 75.96 | 19.68 |
| 1860 | 76.21 | 19.44 |
| 1870 | 76.43 | 19.22 |

TABLE 3-continued

| Wavelength (nm) | Reflectance | Transmittance |
| --- | --- | --- |
| 1880 | 76.66 | 19.01 |
| 1890 | 76.88 | 18.81 |
| 1900 | 77.10 | 18.60 |
| 1910 | 77.32 | 18.38 |
| 1920 | 77.54 | 18.18 |
| 1930 | 77.74 | 17.98 |
| 1940 | 77.95 | 17.79 |
| 1950 | 78.15 | 17.60 |
| 1960 | 78.35 | 17.41 |
| 1970 | 78.55 | 17.22 |
| 1980 | 78.75 | 17.04 |
| 1990 | 78.94 | 16.86 |
| 2000 | 79.13 | 16.68 |
| 2010 | 79.27 | 16.51 |
| 2020 | 79.42 | 16.35 |
| 2030 | 79.56 | 16.19 |
| 2040 | 79.70 | 16.03 |
| 2050 | 79.84 | 15.87 |
| 2060 | 79.98 | 15.72 |
| 2070 | 80.12 | 15.56 |
| 2080 | 80.25 | 15.41 |
| 2090 | 80.38 | 15.26 |
| 2100 | 80.51 | 15.12 |
| 2110 | 80.64 | 14.98 |
| 2120 | 80.76 | 14.84 |
| 2130 | 80.88 | 14.71 |
| 2140 | 81.00 | 14.58 |
| 2150 | 81.12 | 14.45 |
| 2160 | 81.25 | 14.31 |
| 2170 | 81.37 | 14.16 |
| 2180 | 81.50 | 14.02 |
| 2190 | 81.62 | 13.89 |
| 2200 | 81.74 | 13.76 |
| 2210 | 81.84 | 13.65 |
| 2220 | 81.95 | 13.54 |
| 2230 | 82.06 | 13.41 |
| 2240 | 82.18 | 13.29 |
| 2250 | 82.28 | 13.18 |
| 2260 | 82.38 | 13.07 |
| 2270 | 82.48 | 12.96 |
| 2280 | 82.59 | 12.84 |
| 2290 | 82.71 | 12.71 |
| 2300 | 82.82 | 12.59 |
| 2310 | 82.93 | 12.47 |
| 2320 | 83.03 | 12.36 |
| 2330 | 83.13 | 12.25 |
| 2340 | 83.23 | 12.15 |
| 2350 | 83.33 | 12.04 |
| 2360 | 83.43 | 11.94 |
| 2370 | 83.52 | 11.84 |
| 2380 | 83.61 | 11.74 |
| 2390 | 83.70 | 11.65 |
| 2400 | 83.80 | 11.55 |
| 2410 | 83.88 | 11.46 |
| 2420 | 83.97 | 11.36 |
| 2430 | 84.06 | 11.28 |
| 2440 | 84.14 | 11.19 |
| 2450 | 84.22 | 11.11 |
| 2460 | 84.31 | 11.02 |
| 2470 | 84.39 | 10.93 |
| 2480 | 84.48 | 10.84 |
| 2490 | 84.56 | 10.76 |
| 2500 | 84.64 | 10.67 |

Figure 5:
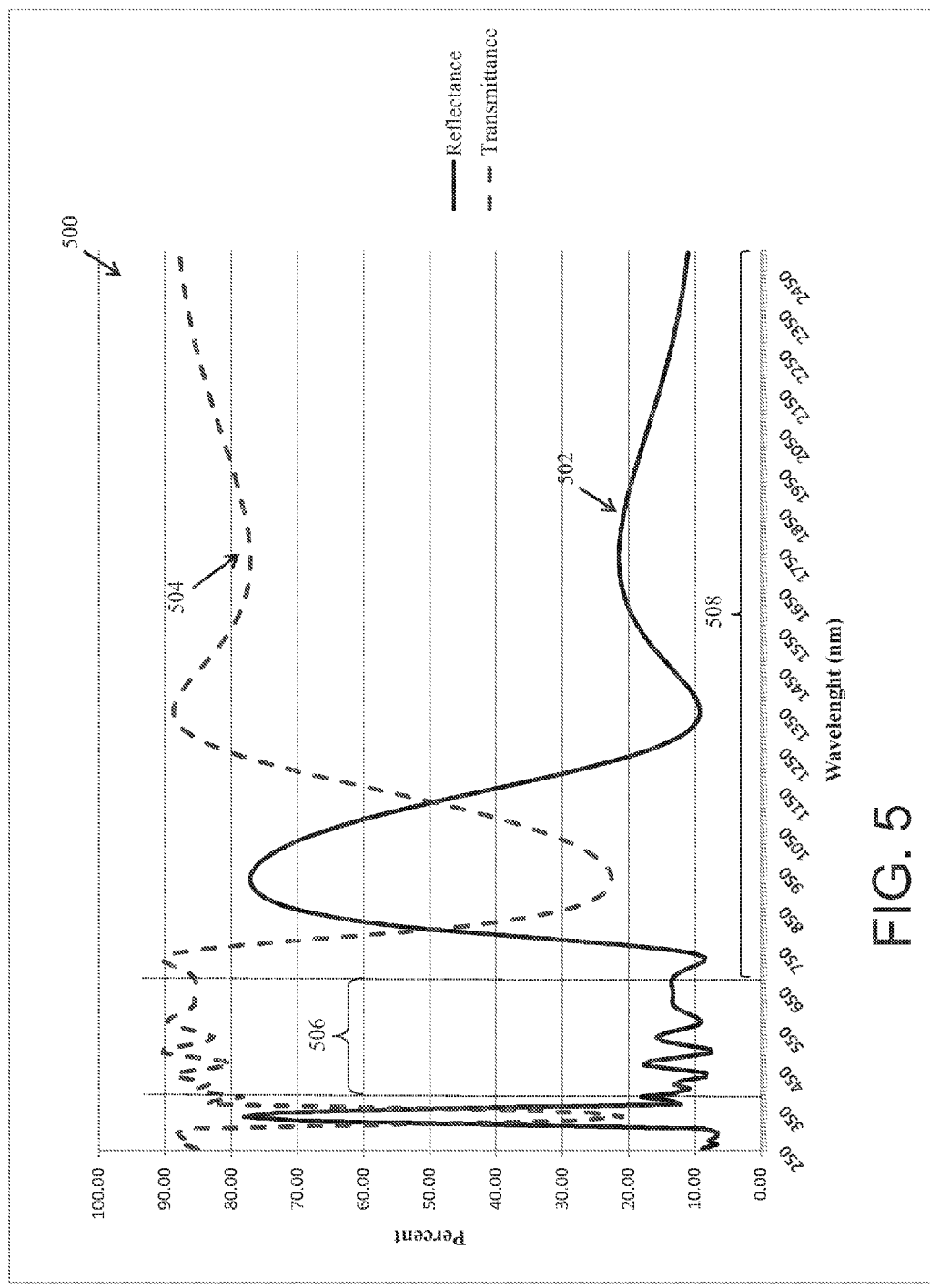
FIG. 5 is a graphical representation of modeled transmittance and reflectance properties of an eight layer thin film device.

FIG. 5 is a graph 500 of the reflectance and transmittance for a dielectric thin film device with PET as the substrate, ITO as a first layer at a thickness of 130 nm, Al2O3 as a second layer at a thickness of 142.63 nm, TiO2 as a third layer at a thickness of 99.37 nm, Al2O3 as a fourth layer at a thickness of 144.67 nm, TiO2 as a fifth layer at a thickness of 97.42 nm, Al2O3 as a sixth layer at a thickness of 146.48 nm, TiO2 as a seventh layer at a thickness of 90.39, and Al2O3 as an eight layer at a thickness of 34.13. The graph 500 includes a reflectance line 502 and a transmittance line 504. The visible spectrum 506 is from about 380 nm to about 700 nm. The infrared spectrum 508 is illustrated on graph 400 from about 700 to about 2500 nm. As illustrated, the average transmittance in the visible light range is about 86.26%. Further, the average reflectance in the infrared spectrum is about 27.12%.

Table 4 is a table of the reflectance and transmittance used to generate graph 500.

TABLE 4

| Wavelength (nm) | Reflectance | Transmittance |
| --- | --- | --- |
| 250 | 8.88 | 85.05 |
| 260 | 6.63 | 87.30 |
| 270 | 7.84 | 86.33 |
| 280 | 6.66 | 87.71 |
| 290 | 6.49 | 88.09 |
| 300 | 8.64 | 86.24 |
| 310 | 40.51 | 56.24 |
| 320 | 69.74 | 28.64 |
| 330 | 78.01 | 20.88 |
| 340 | 72.99 | 25.66 |
| 350 | 49.43 | 48.07 |
| 360 | 12.05 | 83.75 |
| 370 | 13.29 | 82.73 |
| 380 | 18.10 | 78.18 |
| 390 | 13.03 | 83.06 |
| 400 | 10.79 | 85.31 |
| 410 | 13.00 | 83.35 |
| 420 | 12.09 | 84.41 |
| 430 | 8.31 | 88.23 |
| 440 | 8.21 | 88.54 |
| 450 | 13.34 | 83.84 |
| 460 | 17.65 | 79.87 |
| 470 | 16.73 | 80.94 |
| 480 | 11.80 | 85.91 |
| 490 | 7.47 | 90.29 |
| 500 | 7.75 | 90.15 |
| 510 | 11.46 | 86.65 |
| 520 | 14.85 | 83.45 |
| 530 | 15.79 | 82.63 |
| 540 | 14.31 | 84.17 |
| 550 | 11.70 | 86.83 |
| 560 | 9.57 | 89.02 |
| 570 | 8.93 | 89.68 |
| 580 | 9.73 | 88.93 |
| 590 | 11.20 | 87.51 |
| 600 | 12.50 | 86.25 |
| 610 | 13.22 | 85.56 |
| 620 | 13.39 | 85.41 |
| 630 | 13.30 | 85.52 |
| 640 | 13.24 | 85.60 |
| 650 | 13.31 | 85.53 |
| 660 | 13.47 | 85.37 |
| 670 | 13.54 | 85.30 |
| 680 | 13.28 | 85.54 |
| 690 | 12.53 | 86.28 |
| 700 | 11.29 | 87.49 |
| 710 | 9.81 | 88.94 |
| 720 | 8.63 | 90.10 |
| 730 | 8.45 | 90.25 |
| 740 | 10.04 | 88.68 |
| 750 | 13.81 | 84.96 |
| 760 | 19.68 | 79.17 |
| 770 | 26.98 | 71.98 |
| 780 | 34.80 | 64.27 |
| 790 | 42.38 | 56.80 |
| 800 | 49.41 | 49.87 |
| 810 | 55.33 | 44.03 |
| 820 | 60.18 | 39.25 |
| 830 | 64.16 | 35.32 |
| 840 | 67.38 | 32.14 |
| 850 | 69.97 | 29.59 |
| 860 | 72.02 | 27.56 |
| 870 | 73.63 | 25.97 |
| 880 | 74.87 | 24.75 |
| 890 | 75.80 | 23.83 |
| 900 | 76.44 | 23.19 |
| 910 | 76.88 | 22.76 |

TABLE 4-continued

| Wavelength (nm) | Reflectance | Transmittance |
|---|---|---|
| 920 | 77.09 | 22.55 |
| 930 | 77.11 | 22.52 |
| 940 | 76.95 | 22.67 |
| 950 | 76.64 | 22.97 |
| 960 | 76.17 | 23.43 |
| 970 | 75.55 | 24.03 |
| 980 | 74.79 | 24.77 |
| 990 | 73.90 | 25.64 |
| 1000 | 72.85 | 26.66 |
| 1010 | 71.67 | 27.81 |
| 1020 | 70.33 | 29.11 |
| 1030 | 68.85 | 30.56 |
| 1040 | 67.23 | 32.14 |
| 1050 | 65.46 | 33.87 |
| 1060 | 63.54 | 35.74 |
| 1070 | 61.50 | 37.74 |
| 1080 | 59.32 | 39.86 |
| 1090 | 57.01 | 42.12 |
| 1100 | 54.58 | 44.49 |
| 1110 | 52.06 | 46.95 |
| 1120 | 49.47 | 49.49 |
| 1130 | 46.78 | 52.11 |
| 1140 | 44.06 | 54.78 |
| 1150 | 41.30 | 57.48 |
| 1160 | 38.54 | 60.17 |
| 1170 | 35.79 | 62.85 |
| 1180 | 33.08 | 65.49 |
| 1190 | 30.43 | 68.07 |
| 1200 | 27.87 | 70.56 |
| 1210 | 25.43 | 72.93 |
| 1220 | 23.11 | 75.18 |
| 1230 | 20.96 | 77.27 |
| 1240 | 18.96 | 79.21 |
| 1250 | 17.14 | 80.97 |
| 1260 | 15.51 | 82.55 |
| 1270 | 14.08 | 83.93 |
| 1280 | 12.82 | 85.14 |
| 1290 | 11.76 | 86.15 |
| 1300 | 10.88 | 87.01 |
| 1310 | 10.22 | 87.67 |
| 1320 | 9.73 | 88.16 |
| 1330 | 9.41 | 88.48 |
| 1340 | 9.25 | 88.65 |
| 1350 | 9.22 | 88.69 |
| 1360 | 9.32 | 88.60 |
| 1370 | 9.52 | 88.42 |
| 1380 | 9.80 | 88.15 |
| 1390 | 10.16 | 87.81 |
| 1400 | 10.58 | 87.40 |
| 1410 | 11.05 | 86.95 |
| 1420 | 11.55 | 86.47 |
| 1430 | 12.07 | 85.97 |
| 1440 | 12.61 | 85.44 |
| 1450 | 13.17 | 84.91 |
| 1460 | 13.71 | 84.38 |
| 1470 | 14.26 | 83.86 |
| 1480 | 14.80 | 83.34 |
| 1490 | 15.32 | 82.83 |
| 1500 | 15.85 | 82.32 |
| 1510 | 16.35 | 81.85 |
| 1520 | 16.83 | 81.39 |
| 1530 | 17.26 | 80.97 |
| 1540 | 17.68 | 80.58 |
| 1550 | 18.10 | 80.17 |
| 1560 | 18.51 | 79.78 |
| 1570 | 18.83 | 79.49 |
| 1580 | 19.16 | 79.17 |
| 1590 | 19.50 | 78.85 |
| 1600 | 19.75 | 78.61 |
| 1610 | 20.03 | 78.35 |
| 1620 | 20.26 | 78.14 |
| 1630 | 20.47 | 77.94 |
| 1640 | 20.66 | 77.77 |
| 1650 | 20.83 | 77.61 |
| 1660 | 20.98 | 77.48 |
| 1670 | 21.08 | 77.39 |
| 1680 | 21.18 | 77.30 |
| 1690 | 21.27 | 77.22 |
| 1700 | 21.34 | 77.17 |
| 1710 | 21.37 | 77.15 |
| 1720 | 21.42 | 77.11 |
| 1730 | 21.44 | 77.10 |
| 1740 | 21.44 | 77.11 |
| 1750 | 21.42 | 77.14 |
| 1760 | 21.40 | 77.18 |
| 1770 | 21.36 | 77.23 |
| 1780 | 21.30 | 77.30 |
| 1790 | 21.23 | 77.37 |
| 1800 | 21.16 | 77.45 |
| 1810 | 21.07 | 77.55 |
| 1820 | 20.94 | 77.68 |
| 1830 | 20.83 | 77.80 |
| 1840 | 20.78 | 77.86 |
| 1850 | 20.66 | 77.99 |
| 1860 | 20.47 | 78.18 |
| 1870 | 20.35 | 78.32 |
| 1880 | 20.22 | 78.45 |
| 1890 | 20.09 | 78.59 |
| 1900 | 19.93 | 78.75 |
| 1910 | 19.75 | 78.94 |
| 1920 | 19.58 | 79.11 |
| 1930 | 19.42 | 79.28 |
| 1940 | 19.26 | 79.45 |
| 1950 | 19.08 | 79.63 |
| 1960 | 18.91 | 79.81 |
| 1970 | 18.73 | 79.99 |
| 1980 | 18.54 | 80.18 |
| 1990 | 18.36 | 80.37 |
| 2000 | 18.17 | 80.57 |
| 2010 | 17.98 | 80.76 |
| 2020 | 17.79 | 80.95 |
| 2030 | 17.60 | 81.15 |
| 2040 | 17.41 | 81.34 |
| 2050 | 17.22 | 81.53 |
| 2060 | 17.03 | 81.72 |
| 2070 | 16.84 | 81.92 |
| 2080 | 16.65 | 82.11 |
| 2090 | 16.47 | 82.30 |
| 2100 | 16.28 | 82.49 |
| 2110 | 16.10 | 82.68 |
| 2120 | 15.91 | 82.86 |
| 2130 | 15.73 | 83.05 |
| 2140 | 15.54 | 83.24 |
| 2150 | 15.36 | 83.42 |
| 2160 | 15.18 | 83.60 |
| 2170 | 15.02 | 83.77 |
| 2180 | 14.85 | 83.94 |
| 2190 | 14.69 | 84.10 |
| 2200 | 14.52 | 84.27 |
| 2210 | 14.35 | 84.45 |
| 2220 | 14.18 | 84.62 |
| 2230 | 14.02 | 84.78 |
| 2240 | 13.87 | 84.93 |
| 2250 | 13.71 | 85.09 |
| 2260 | 13.56 | 85.25 |
| 2270 | 13.41 | 85.41 |
| 2280 | 13.27 | 85.54 |
| 2290 | 13.15 | 85.67 |
| 2300 | 13.02 | 85.79 |
| 2310 | 12.90 | 85.92 |
| 2320 | 12.77 | 86.05 |
| 2330 | 12.64 | 86.18 |
| 2340 | 12.52 | 86.30 |
| 2350 | 12.40 | 86.42 |
| 2360 | 12.29 | 86.54 |
| 2370 | 12.17 | 86.66 |
| 2380 | 12.06 | 86.77 |
| 2390 | 11.96 | 86.88 |
| 2400 | 11.86 | 86.98 |
| 2410 | 11.76 | 87.08 |
| 2420 | 11.66 | 87.18 |
| 2430 | 11.57 | 87.28 |
| 2440 | 11.48 | 87.37 |
| 2450 | 11.40 | 87.45 |

TABLE 4-continued

| Wavelength (nm) | Reflectance | Transmittance |
|---|---|---|
| 2460 | 11.33 | 87.53 |
| 2470 | 11.25 | 87.61 |
| 2480 | 11.18 | 87.68 |
| 2490 | 11.11 | 87.75 |
| 2500 | 11.05 | 87.81 |

Furthermore, using the technology described herein, it is anticipated that embodiments of infrared-control coated thin film devices can be created that will have even more advantageous transmittance and reflectance properties. For example, in an embodiment, an infrared-control coated thin film device will have greater than 70% visible light transmittance while maintaining greater than 70% reflectance. In another embodiment, an infrared-control coated thin film device may have greater than 75% visible light transmittance while maintaining greater than 75% reflectance. In another embodiment, an infrared-control coated thin film device may have greater than 80% visible light transmittance while maintaining greater than 80% reflectance. In another embodiment, an infrared-control coated thin film device may have greater than 85% visible light transmittance while maintaining greater than 85% reflectance. In another embodiment, an infrared-control coated thin film device may have greater than 90% visible light transmittance while maintaining greater than 90% reflectance. In another embodiment, an infrared-control coated thin film device may have greater than 95% visible light transmittance while maintaining greater than 95% reflectance. In other embodiments, transparency and reflectance need not be equal. For example, an infrared-control coated thin film device may have greater than 85% visible light transmittance while maintaining greater than 55% reflectance.

Figure 6:
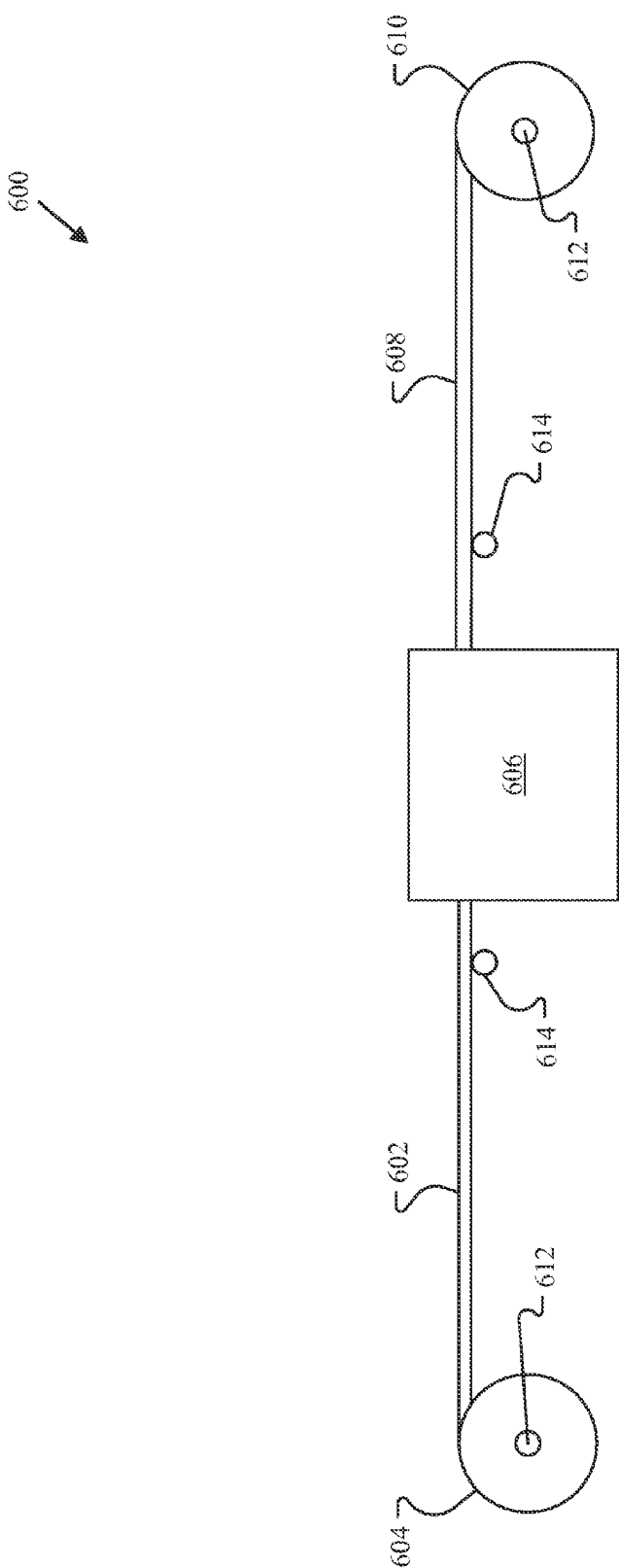
FIG. 6 illustrates a roll-to-roll system for depositing one or more layers on a substrate.

FIG. 6 illustrates a roll-to-roll system 600 for depositing one or more infrared controlling layers on a substrate. A roll-to-roll system allows the manufacture of multiple devices in a continuous or semi-continuous process. A roll-to-roll system is so named for having a web (e.g., a PET substrate) translate (i.e., move) from a starting roll, through a system, to another starting roll. During translation, one or more processes are performed on the web. At the end of the system, the web is wound or cut into individual devices. This allows for, in certain processes, a faster manufacturing time.

The system 600 causes translation of the web 602 housed on a unwind spool 604. Process chamber 606 deposits one or more infrared-controlling layers on to the web 602 to form a post-process web 608. The post-process web 608 is wound onto a wind spool 610.

Translation of the web through the system 600 may be accomplished in various ways. A guide track or other means may be used to mechanically support the translation of the web 602 through system 600. As illustrated spools 604 and 606 have mandrels 612 on which a web may be spooled. For example, a fully spooled mandrel may have 20" outside diameter and a 6" core, and be 1.2 meters wide. Various idler rollers 614 may guide the web 602 and the post process web 608. Idler rollers may be designed for removal for periodic cleaning. In embodiments, the idler roller surface roughness may be 8 micro-inch rms. Idler rollers may spin freely, and they may have low rotational inertia. Idler rollers may have active sensors to indicate positive motion.

The web 602 may translate through the system 600 at specified rate. In an embodiment, for example, the system 600 at a rate of 1 to 48 inches per minute. This speed may be set to be constant during processing or may vary as needed. Acceleration and deceleration of spools 604 and 610 may be controlled, which may help prevent slack in the spool. Tension of the web 602, may be set at 10-50 lbf for a 1 meter wide device or substrate.

Process chamber 606 is a chamber where one or more manufacturing techniques are used to deposit an infrared-control thin film layers. Processes in include physical vapor deposition, chemical vapor deposition, ion beam assisted evaporation, pulsed laser deposition, sputter deposition, and sol-gel processes.

In an embodiment, process chamber 606 includes a pulsed-energy microwave chemical vapor deposition process to form at least one layer, such as one or more infrared-controlling layers. In a pulsed-energy microwave chemical vapor deposition process, microwave energy is pulsed to ignite and maintain a plasma. It is believed that pulsing the microwave allows for the control of the rate of production of ions, the energy of ions, and the rate the ions strike a substrate or web. For certain pulse frequencies, this increases the deposition rate of material on a substrate at a given temperature while maintaining the quality of the deposited layer. Accordingly, lower temperatures may be used to achieve the same deposition rate. For example, the temperature of substrate may be kept at or below 250° C., 240° C., 230° C., 220° C., 210° C., or 200° C. during deposition, which allows for the use of substrates with lower melting points. Additionally, the rate of deposition may occur at a rate of greater than 50 angstroms per second, 60 angstroms per second, 70 angstroms per second, 80 angstroms per second, 90 angstroms per second, and 100 angstroms per second.

Though system 600 depicts only one process chamber, other embodiments may have more than one process chamber to deposit one or more infrared-control coated devices onto a web. Still, other embodiments include other process systems to further treat a web. For example, a first process chamber may use pulsed energy microwave plasma enhanced chemical vapor deposition. A second process chamber may use sputtering deposition. The sputtering chamber may deposit materials such as ITO.

Finished infrared-control coated devices may then be cut from the web by any suitable means. In alternative embodiments, a mechanical, hydraulic, or pneumatic press is employed. In such embodiments, formation of the post-process web 608 may occur in a semi-batch manner. A wind module 610 receives the post-process web 608. Wind module has a mandrel 612 designed to receive the post-process web 608.

Figure 7:
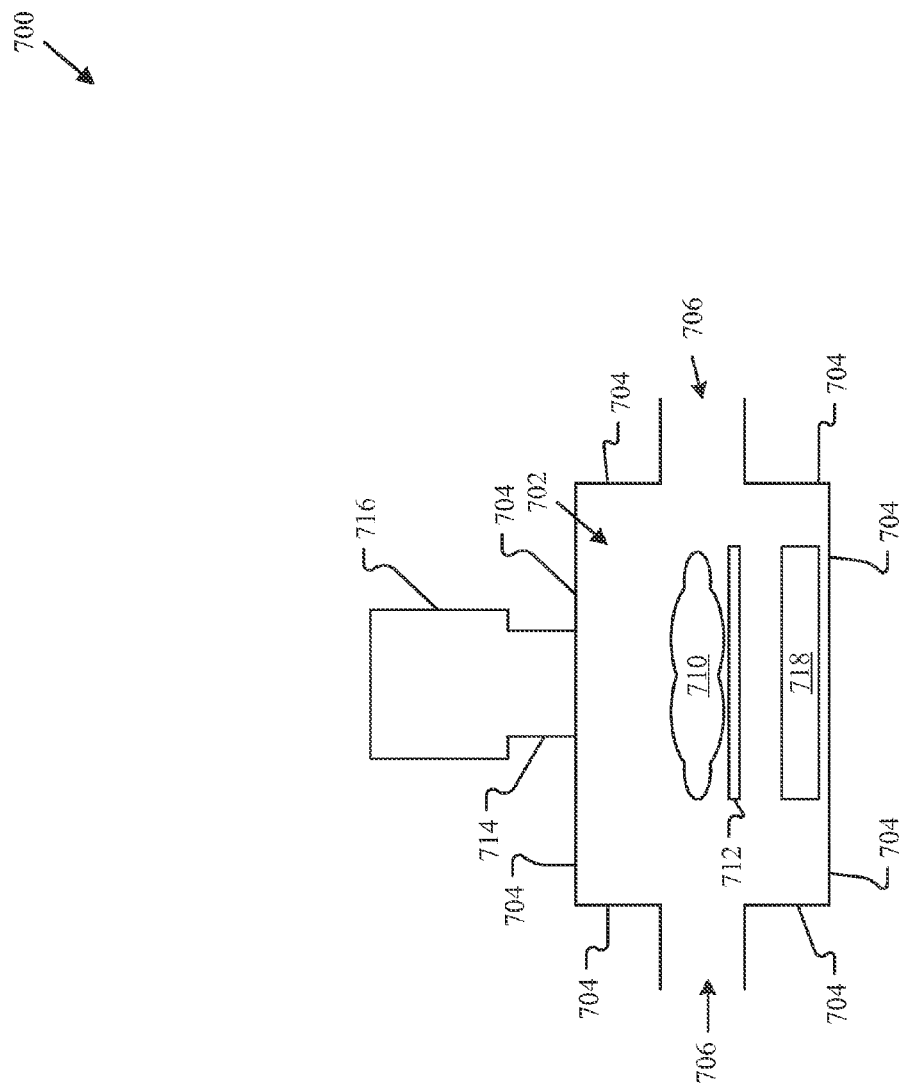
FIG. 7 illustrates an example waveform of a pulsed microwave that may be used in conjunction systems and methods described herein.

FIG. 7 is an embodiment of a microwave plasma enhanced chemical vapor deposition chamber 700. As illustrated, FIG. 7 includes a process chamber 702 defined by process chamber walls 704, an inlet gas line 706, an outlet gas line 708, a plasma sheath 710, a substrate 712, a microwave wave guide 714, and a microwave generator 716. Temperature is controlled by a temperature control element 718.

The process chamber 702 is a chamber defined by chamber walls 704. The process chamber is generally configured to maintain an internal pressure. This pressure is determined in part by the inflow of gases from inlet gas line 706 and outlet gas line 708. The pressure and temperature in the process chamber 702 affects the material deposited on the substrate 712.

In an embodiment, non-reactive gases such as helium or argon flow in through inlet gas line 706. Additionally, a source gas, such as hexamethyldisiloxane (HMDSO), diethyl zinc (DEZ), trimethyl aluminum (TMA), etc., are pumped into the chamber through the inlet gas line 706. Gas exits the system from outlet gas line 708. Process conditions in process chamber 702 vary. In an embodiment, the process pressure ranges from 100-220 mTorr. In an embodiment, HMDSO and O2 are pumped into the chamber 708 at a ratio of HMDSO to O2 ranging from 10-80.

Ions produced in the plasma sheath 710 have an energy distribution. The energy distribution of the produced ions is dependent on, inter alia, the microwave frequency and pulse produced by microwave generator 716. Some of the source gas and/or its reactants will be deposited onto a substrate 712. In an embodiment, the source gas reacts with one or more other process gases and the resulting compound deposits onto the substrate 712. This reaction may occur at the surface of the substrate 712, above the substrate 712, and/or after material has been deposited on the substrate 712.

Deposited material will form structures, and those structures depend on the kinetic energy of ions created in the plasma sheath 710. For example, a layer of deposited material may be present on the substrate 712. The deposited material, given certain process conditions, will form a lattice or crystal structure. A lattice structure occurs when the deposited material is arranged in a substantially ordered manner. In other process conditions, however, a lattice structure will not form. Process conditions include the presences of impurities, the kinetic energy of the source gas at the time of colliding with substrate 712, and any other mechanisms that may control the transfer of kinetic energy of the deposited material. In embodiments, one such mechanism is to control the energy of ions through the use of the microwave generator 712.

A plasma 710 is ignited using microwave energy. The microwave wave generator 716 may have a power controller. The microwaves may be directed at plasma sheath 710 through use of a microwave guide 714. In an embodiment, the microwave generate will generate microwaves at a frequency of 2.54 GHz. In other embodiments, different microwave frequencies are used. The controller controls the power supplied to the microwave generator. In an embodiment, the microwave controller may pulse power to the microwave generator to form a pulsed waveform. In an embodiment, pulsing occurs at a rate of 100 Hz. In another embodiment, pulsing occurs at 10 Hz. Still in others, pulsing may occur at various cycles per second, including: 20 Hz, 30 Hz, 40 Hz, 50 Hz, 60 Hz, 70 Hz, 80 Hz, 90 Hz, 110 Hz, 120 Hz, 130 Hz, 140 Hz, and 150 Hz. Indeed, the cycle speed of the microwave may vary over the course of a given deposition.

A heating element 718 may be used to heat the process chamber. The heating element 718 may generate heat through any means now known or later developed. Accordingly, may be one of conductive, convective, or radiative means.

Figure 8:
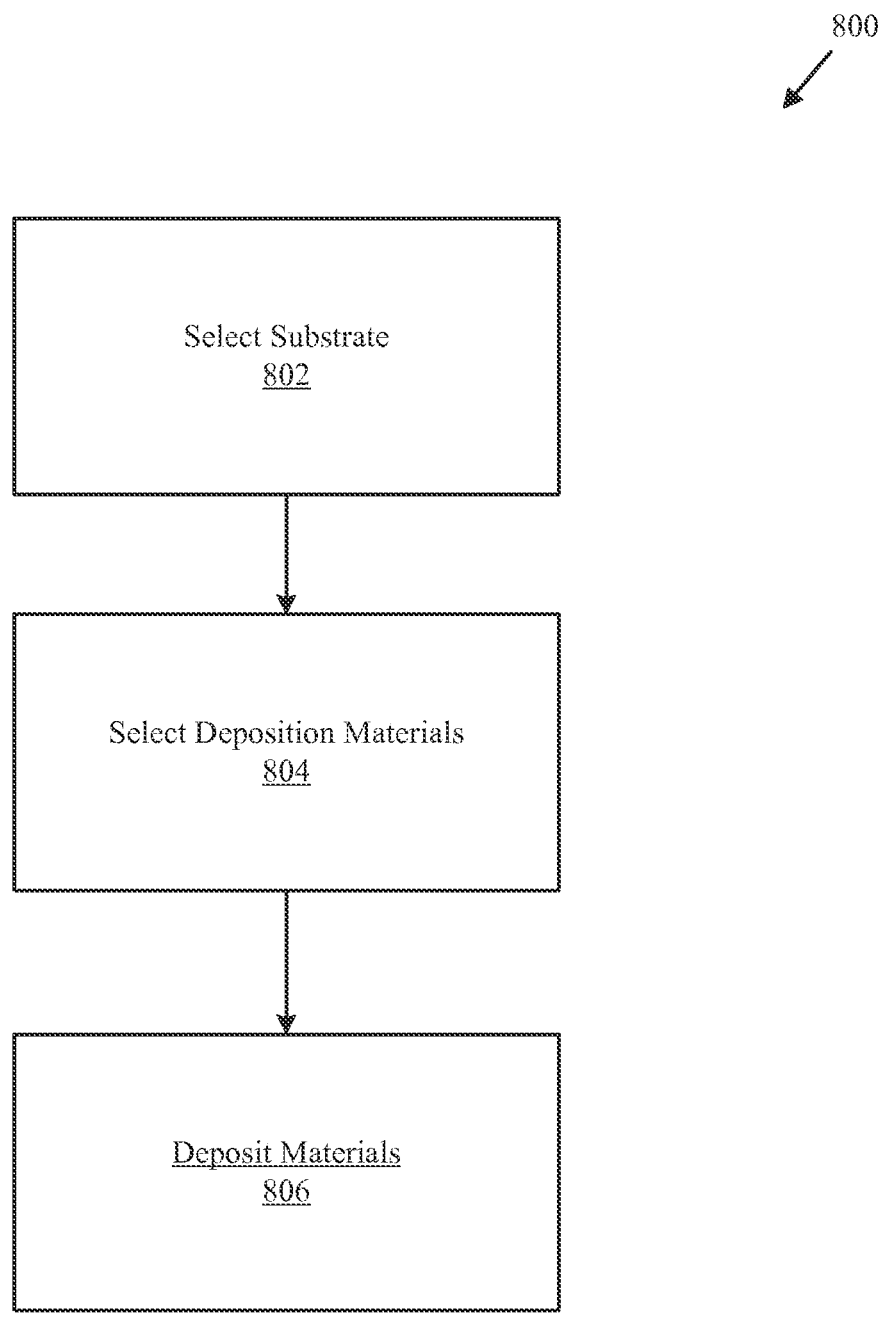
FIG. 8 is an embodiment of a method for manufacturing a multilayered infrared-control coated device.

FIG. 8 is an embodiment of a method 800 for depositing infrared controlling layers on a substrate. Method 800 begins with select a substrate operation 802. The substrate may be flexible or rigid. For example, the substrate may be a material with a relatively low melting point compared to glass. In an embodiment, the substrate is one of polyethylene terephthalate ("PET"), polyethylene napthalate (PEN), polycarbonate, or transparent polymides, etc. In other embodiments, the substrate may be a transparent organic polymer or a transparent inorganic polymer. Still in other embodiments, the substrate is a ceramic or glass.

The method 800 continues to select deposition material operation 804. Selection of deposition material will determine the reflectance and transmittance properties of the infrared-control coated thin film device. In an embodiment, selection of deposition materials will determine the types of source gases that may be used.

The method the 800 continues to deposit material operation 806. In an embodiment, pulsed microwave-energy chemical vapor deposition is used. In other embodiments, deposit material operation 804 occurs using at least one of physical vapor deposition, chemical vapor deposition, thermal evaporation, pulsed laser deposition, sputter deposition, and sol-gel processes. In an embodiment, one or more of these processes occurs in series.

For example, deposit in deposit material operation 806, one or more layers may be deposited. For example, a first layer of SiO2 may be deposited using pulsed energy microwave plasma enhanced chemical vapor deposition. After the deposition of the SiO2, a layer of TiO2 may be deposited on the SiO2 layer. The TiO2 may be deposited using a variety of techniques listed above. In an embodiment, the TiO2 layer is deposited using microwave plasma enhanced chemical vapor deposition. The rate of pulsing of the microwave may be the same or different from the rate at which the microwave was pulsed during the deposition of the SiO2 layer.

FIGS. 9 through 16 represents technology related to sputtering deposition that may be used to create one or more layers of an infrared-control coated thin film device.

Figure 9:
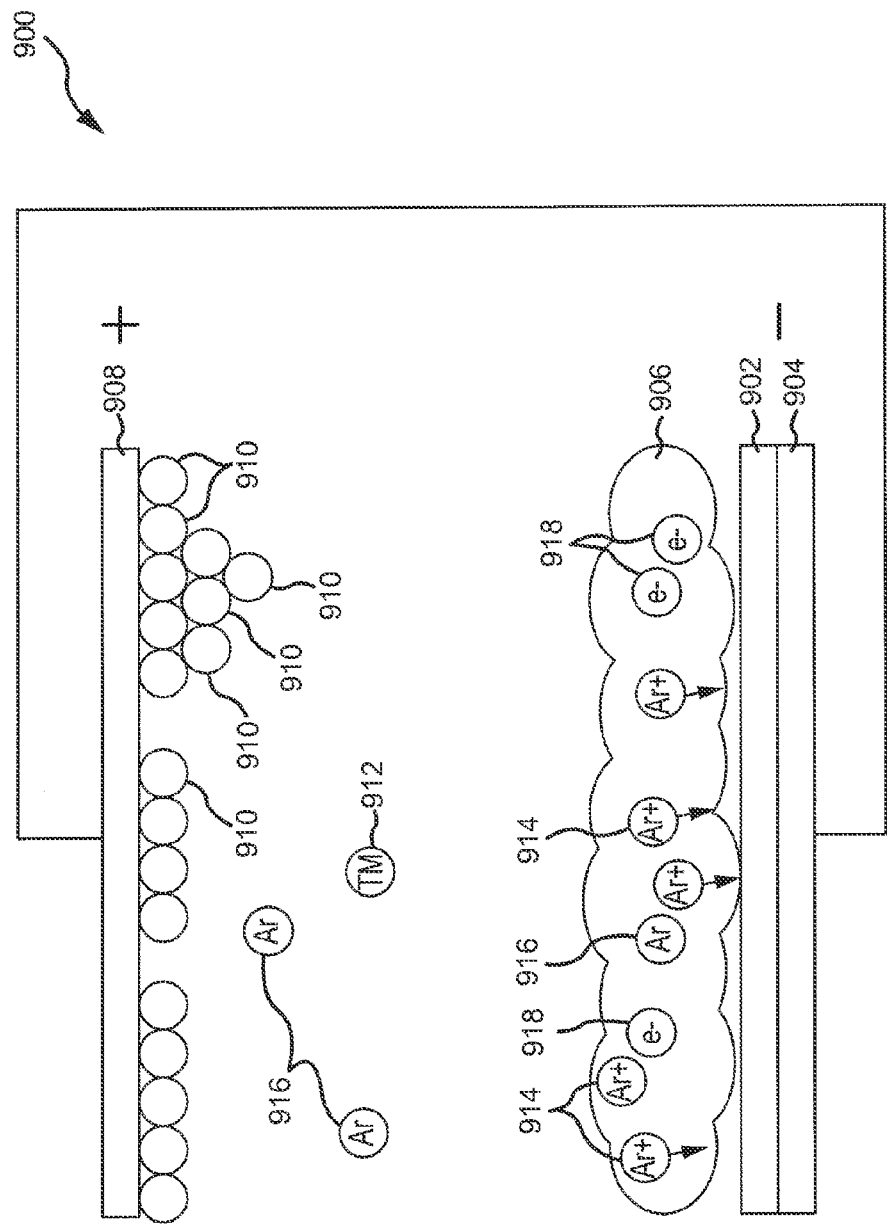
FIG. 9 illustrates the prior art of a planar sputtering cathode system.

FIG. 9 represents prior art of a planar sputtering cathode system 900. Planar sputtering cathode system 900 includes a target 902, a cathode 904, a plasma sheath 906, a substrate 908, deposited material 910, a sputtered species 912, ions 914, and process gas particles 916.

In a planar sputtering cathode system 900, a target 902 may have a magnetic field applied to it. This magnetic field helps contain a plasma sheath 906 to the surface of a target 902 or near the surface of target 902. The magnetic field may confine electrons and secondary electrons to on and/or near the surface of a target. In an embodiment, the characteristics of the magnetic field affect the path of the electrons that travel around the surface of a target 902. The target 902 may be any material suitable for sputtering.

A cathode 904 has a voltage applied to it. In embodiments, a DC current is applied to a cathode 904. This DC current, which may create a 300V energy potential between the cathode 904 and the substrate 908, may be applied in order to ignite the plasma and generate ions 914. Some electrons 918 produced within the plasma sheath 906 have sufficient energy to meet the first ionization potential of the process gas particle 916. Consequently, some process gas particles 916 become positive ions 914.

Ions 914 produced in the plasma sheath 906 have an energy distribution. The energy distribution of the produced ions 914 is dependent on, inter alia, the current applied to the cathode 904, the waveform of that current, and the process gas used in the system.

Positive ions 914 accelerate toward a negatively charged cathode 904. The positive ions may collide with a target 902 and cause a sputtered species 912 to be ejected. Some of the sputtered species 912 will then be deposited onto a substrate 908. As such, sputtered species 912 may be the same material as both the target 902 and the deposited material 910. In other embodiments, the target material reacts with one or more process gases and the resulting compound deposits onto the substrate 908. This reaction may occur at the surface of the target 902, during the travel of sputtered species 912, and/or after material has been deposited on the substrate to form deposited material 910.

Deposited material 910 will form structures, and those structures depend on the kinetic energy of incoming sputtered species 912. For example, a layer of deposited material 910 may be present on the substrate 908. The deposited material 910, given certain process conditions, will form a lattice or crystal structure. A lattice structure occurs when the deposited material 910 is arranged in a substantially ordered manner. In other process conditions, however, a lattice structure will fail to form. Process conditions include the presences of impurities, the kinetic energy of the sputtered species 912 at the time of colliding with deposited material 910, and any other mechanisms that may control the transfer of kinetic energy to the deposited material 910. In embodiments, one such mechanism is to control the energy of ions 914. The relationship between kinetic energy and lattice structure is described more fully with reference to FIG. 10.

In general, the energy of sputtered species 912 is directly proportional to the kinetic energy of the ions 914. For example, some ions 914 collide with the target 902 and transfer energy to the target 902. As a result of this collision, some material of the target 902 is ejected and becomes a sputtered species 912. Thus, high-energy ions 914 striking a target 902 will cause sputtered species 912 to have a greater kinetic than low-energy ions 914. Additionally, upon striking the substrate 908, the sputtered species 912 transfers kinetic energy to the previously deposited material 910.

Another way ions 914 may affect the kinetic energy transferred to deposited material 910 is through ion 914 bombardment of the deposited material 910. For example, in instances where the polarity of the cathode is reversed, the positive ions 914 may accelerate toward a negatively charged substrate 908. In another embodiment, the substrate 908 does not hold a charge and the positive ions 914 accelerate toward a negatively charged area near a substrate 908. Ions 914 with a high kinetic energy that collide with deposited material 910 will transfer more kinetic energy than ions 914 with a lower kinetic energy. Furthermore, the more ions 914 that bombard deposited material 910, the more kinetic energy will transfer to the deposited material 910. Thus, the rate of ion 914 bombardment affects the kinetic energy transferred to deposited material 910.

Figure 10:
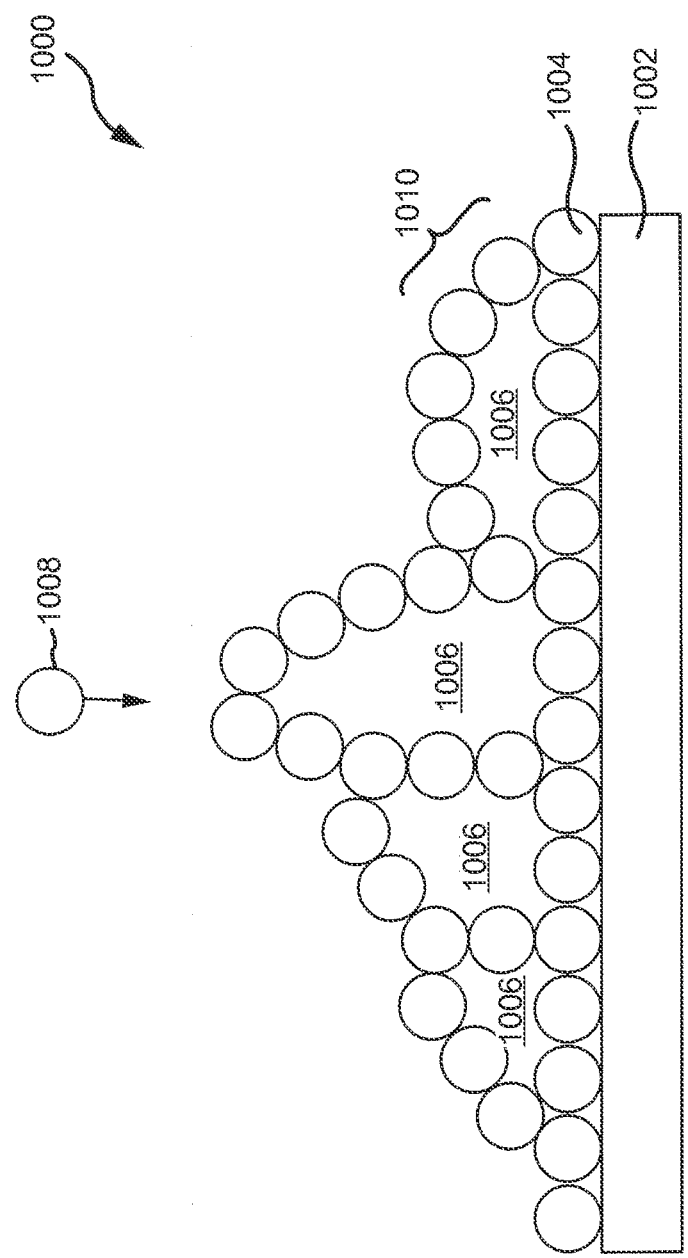
FIG. 10 illustrates a thin film with interstitial voids.

With respect to FIG. 10, FIG. 10 illustrates a thin film 1000. In the embodiment shown, a substrate 1002 is illustrated with a thin film of deposited material 1004. Thin films with interstitial voids are known in the art. The deposited thin film 1000 is illustrated as having a substrate 1002, a deposited material 1004, interstitial voids 1006, and a sputtered species 1008.

For certain thin films, it may be desirous to remove or limit the number of interstitial voids 1006 that may form during deposition. For example, interstitial voids increase the electrical resistivity of thin films for certain materials. Controlling the transfer of kinetic energy to deposited material 1004 may limit the number of interstitial voids 1006 that form during deposition, and thus reduce the electrical resistivity of the thin film.

For certain deposited materials 1004, interstitial voids 1006 occur when a target material fails to have sufficient kinetic energy to meet or overcome the Schwoebel-Ehrlich barrier. Failure to meet the Schwoebel-Ehrlich barrier causes deposited material 1004 to form sloping regions 1010. Sloping regions 1010 tend to cause interstitial voids 1006. On the other hand, deposited material 1004 that has sufficient energy to overcome the Schwoebel-Ehrlich barrier may form a surface with a high surface symmetry. That is, the deposited material 1004 will form less sloping regions and arrange more evenly across the surface of the substrate 1002. As such, transfer of kinetic energy to a deposited material 1004 may allow the deposited material 1004 to have a sufficient energy to overcome the Schwoebel-Ehrlich barrier.

Additionally, it may also be desirous to limit the amount of kinetic energy transferred because too much kinetic energy transfer may damage the fidelity of the deposited material's 1004 lattice structure. Damaging the lattice structure may also increase the electrical resistivity of a thin film.

Controlling the transfer of kinetic energy may occur by controlling the kinetic energy of incoming sputtered species 1008. Controlling the transfer of energy may also occur through controlling ion kinetic energy and the rate of ion bombardment. Energy transfer to a deposited material is discussed further with reference to FIG. 9.

As such, it may be desirable to have an energy waveform applied to a cathode that can create ions at an appropriate rate and an appropriate energy for generating thin films with a targeted electrical resistance. This waveform will be referred to as a finely tuned waveform.

Figure 11:
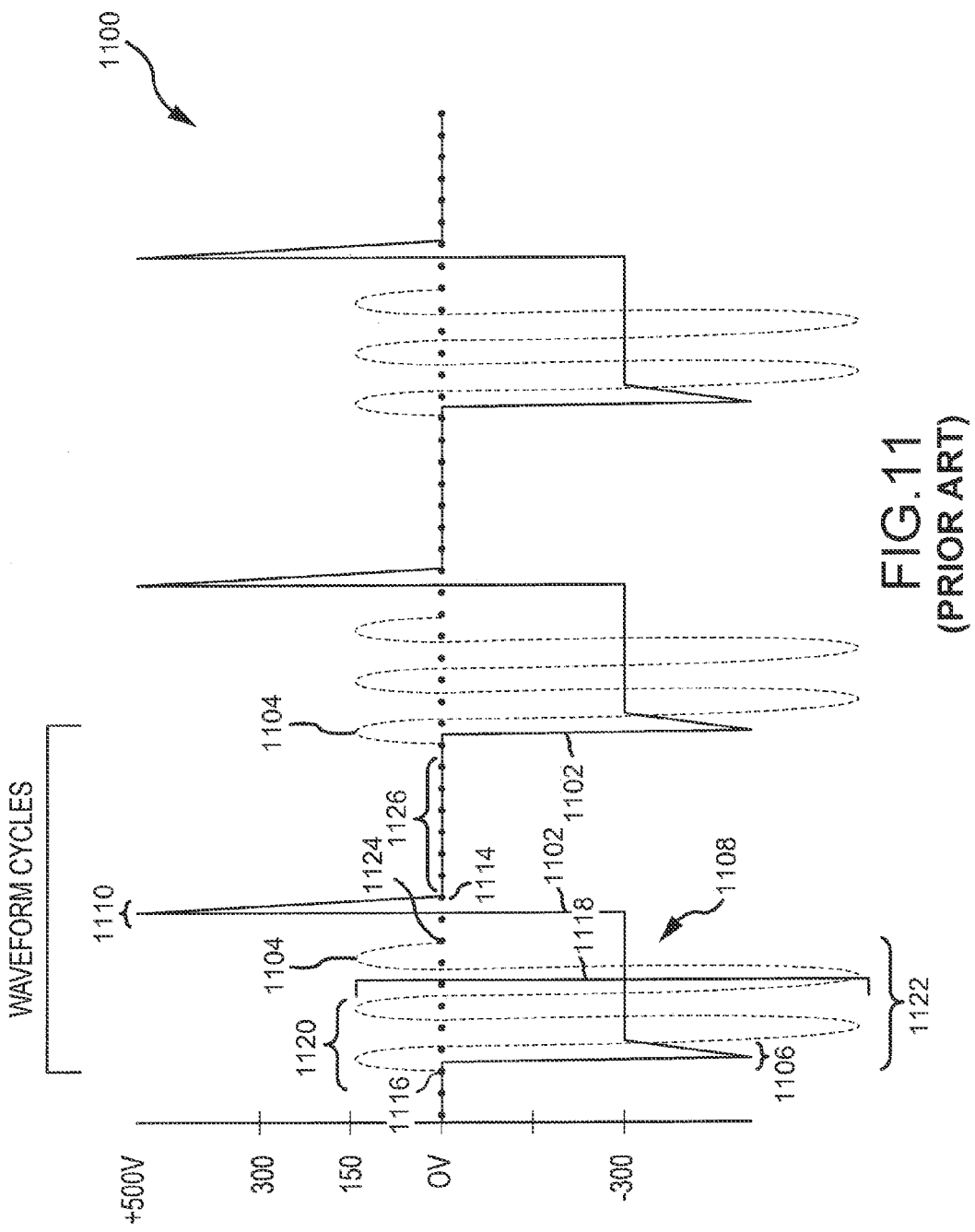
FIG. 11 illustrates the prior art of an RF waveform super positioned on a pulsed DC waveform.
Figure 12:
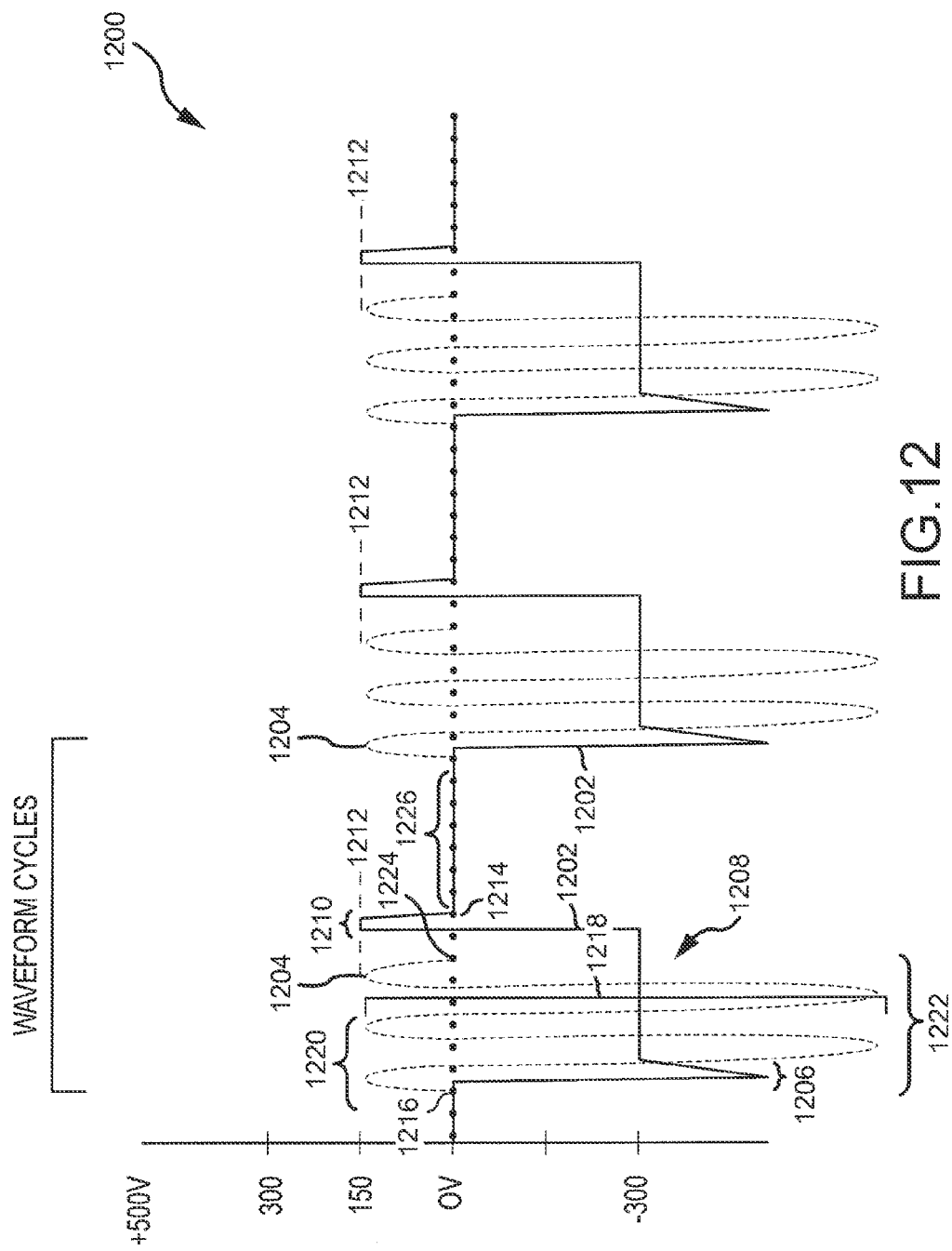
FIG. 12 illustrates a waveform that combines an RF waveform super positioned on pulsed-DC with a reverse voltage limiting threshold.

With reference to FIGS. 11 and 12, FIG. 11 illustrates the prior art of an RF waveform super positioned on a pulsed DC waveform 1100. FIG. 12, which is not prior art, illustrates a composite waveform 1200 that combines RF super positioned on pulsed-DC with a reverse voltage limiting threshold. Waveform 1100 and composite waveform 1200 have a pulsed-DC waveform 1102 and an RF waveform 1104. Composite waveform 1200 may be applied to a cathode of a sputtering deposition process in order to adjust the energy of the plasma.

Additionally the pulsed-DC waveform 1102 includes a plasma ignition portion 1106, a steady-state portion 1108, a reverse DC voltage portion 1110, and a pulsed-DC termination point 1114.

In an embodiment, the application of waveform 1100 or composite waveform 1200 to a cathode ignites a plasma in a sputtering deposition chamber. The plasma ignition occurs contemporaneous with a plasma ignition portion 1106. In another embodiment, the application of an RF waveform 1104 causes a plasma to ignite.

During plasma ignition, ions are generated. When a waveform 1100 or a composite waveform 1200 is applied to a cathode of a sputtering deposition chamber, generation of positive ions continues through the duration of a steady-state portion 1108. The positive charge of these ions causes the ions to propel toward a negatively charged cathode. The resulting collision with the target propels target material toward a substrate for deposition. The steady-state portion 1108 may have a voltage that is set at −50V, −60V, −70V, −80V, −90V, −100V, −110V, −120V, −130V, −140V, −150V, −160V, −170V, −180V, −190V, −200V, −210V, −220V, −230V, −240V, −250V, −260V, −270V, −280V, −290V, −300V, −310V, −320V, −330V, −340V, −350V, −360V, −370V, −380V, −390V, −400V, −410V, −420V, −430V, −440V, −450V, −460V, −470V, −480V, −490V, and −500V.

In the waveform 1100 and composite waveform 1200 shown, a reverse DC voltage portion 1110 occurs after steady-state portion 1108. When applied to a cathode, the reverse DC voltage portion 1110 changes the polarity of the cathode from negative to positive.

As shown, waveform 1100 and composite waveform 1200 have an RF waveform 1104 superimposed on the pulsed-DC waveform 1102. An RF waveform has an RF initiation point 1116, an amplitude 1118, a frequency 1120, and an RF application duration 1122. As illustrated, the waveforms 1100 and 1200 have an RF power termination point 1124.

In embodiments, an RF initiation point 1116 may occur at or near the same time as the plasma ignition portion 1106. When the waveform 1100 or waveform 1200 is applied to a cathode, RF initiation point 1116 marks the initiation of the application of the RF waveform 1104 to a cathode of a sputtering deposition chamber. When applying RF waveform 1104 to a cathode, varying the frequency 1120 and the amplitude 1118 of the RF waveform 1104 will generate ions with certain energy distributions. Furthermore, the density of ions created in a plasma sheath is directly proportional to the frequency 1120. For example, at 13.56 mhz an RF waveform 1104 may create ions at a faster rate than a lower frequency. Ion generation occurs during RF application duration 1122 until an RF power termination point 1124. RF power termination point 1124 may occur sometime before a reverse DC voltage portion 1110. Ensuring that the RF power termination point 1124 occurs before a reverse DC voltage portion 1110 may be accomplished by various analog and digital control techniques, or some combination of the two techniques.

Alternatively, RF is applied continuously until the final waveform cycle. In this embodiment, the RF is applied continuously through all stages of the pulsed-DC waveform 1102.

A reverse DC voltage portion 1110 may occur by design or may be caused intrinsically by shutting off a DC power supply. When applied to a cathode, the reverse DC voltage portion 1110 reverses the polarity of the cathode from negative to positive. When this reversal occurs in a sputtering deposition chamber, the positive ions will accelerate toward the now negatively charged substrate (or a negatively charged area near the substrate). This depletes the ion density of the plasma sheath and substantially halts the deposition of sputtered species. In the prior art waveform 1100, the kinetic energy of the ions striking the substrate is directly proportional to the magnitude of the reverse DC voltage portion 1110.

In embodiments, it may be desirous to limit the magnitude of the reverse voltage. Composite waveform 1200 includes a reverse voltage threshold 1212. This limits the magnitude of the reverse voltage limiting portion. Limiting the magnitude of the reverse voltage limits the kinetic energy of the ions accelerating toward the substrate during a reverse DC voltage portion 1110.

Limiting the reverse voltage may be accomplished through electronic devices along with analog and digital controllers. In some embodiments where the target is non-metallic, a reverse voltage limiting may interfere with the RF waveform. As described in greater detail below, the systems and methods disclosed herein account for this and prevent interference with the RF waveform while still allowing the reverse DC voltage to be limited.

Application of the reverse voltage threshold 1212 may be depend on the specific sputtering environment. For example, in an embodiment where the process gas is Ar, and the deposition material is transparent conductive oxide ("TCO"), a reverse DC voltage portion 1110 may last for between 0.5 and 10 mircoseconds. In embodiments, the reverse DC voltage portion lasts for a microsecond. Additionally, a reverse voltage threshold 1112 may be set between 100 and 300 volts.

Furthermore, the composite waveform 1200 may be applied at a 10 kHz, 20 kHz, 30 kHz, 40 kHz, 50 kHz, 60 kHz, 70 kHz, 80 kHz, 90 kHz, 100 kHz, 110 kHz, 120 kHz, 130 kHz, 140 kHz, 150 kHz, 160 kHz, 170 kHz, 180 kHz, 190 kHz, 200 kHz, 210 kHz, 220 kHz, 230 kHz, 240 kHz, 250 kHz, 260 kHz, 270 kHz, 280 kHz, 290 kHz, 300 kHz, 310 kHz, 320 kHz, 330 kHz, 340 kHz, 350 kHz, 360 kHz, 370 kHz, 380 kHz, 390 kHz, 400 kHz, 410 kHz, 420 kHz, 430 kHz, 440 kHz, 450 kHz, 460 kHz, 470 kHz, 480 kHz, 490 kHz, or 500 kHz.

As shown, rest period 1126 is present in waveform 1100 and composite waveform 1200. If applied to a cathode, rest period 1126 represents the time in which no pulsed-DC power is supplied to the cathode. The rest period 1126 is defined as the time between the termination of the application of a DC pulse and the next application of a DC pulse. A rest period may not be present or may be of a short or long duration relative to the DC pulse duration.

A cycle of a waveform 1100 or waveform 1200 is calculated by summing the time from the first application of power to the cathode until the end of a rest period 1126.

Figure 13:
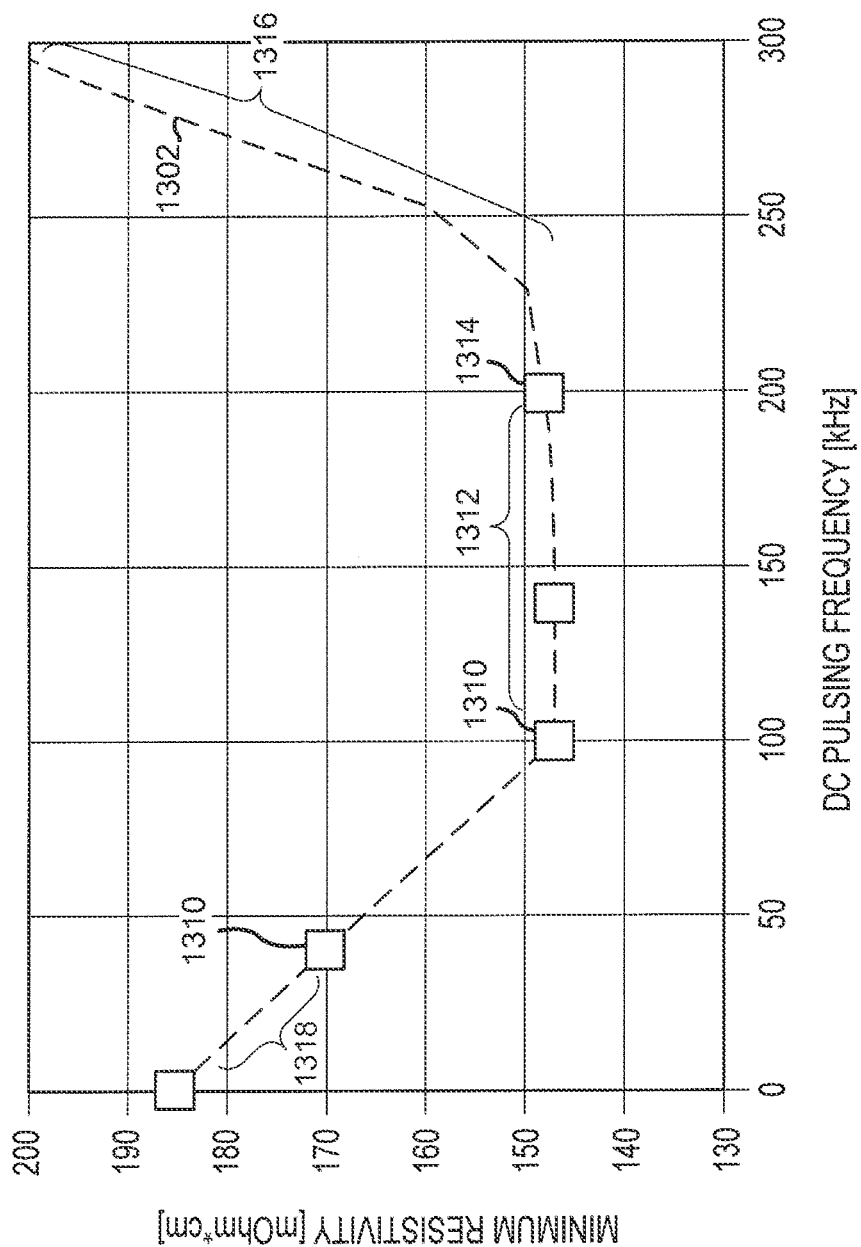
FIG. 13 illustrates the expected resistivity properties of thin films when a waveform 300 is applied to a cathode.

FIG. 13 illustrates the expected resistivity properties of thin films created when a waveform 1100 is applied to a cathode. The y-axis of the graph illustrates the minimum resistivity $\mu$Ohm*cm. The x-axis represents the frequency at which the DC pulse would be applied to a cathode of a sputtering deposition chamber. Line 1302 illustrates the resistivity of a thin-film that may be produced by applying an embodiment waveform 1100, i.e., an RF waveform superimposed on pulsed-DC waveform to a cathode of a sputtering deposition chamber.

Line 1302 may be understood as having three frequency ranges. In the first range, the minimum resistivity of the thin film decreases in a decreasing resistivity range 1308. As illustrated, line 1302 illustrates the resistivity decreasing from ~185 to ~148 $\mu$Ohm*cm over the decreasing resistivity range 1308. This corresponds to a frequency of 0 to ~100 kHz DC-pulsed. At a steady-state point 1310 the resistivity of the thin film no longer decreases. As illustrated, the steady-state point is ~100 kHz. The steady-state point 1310 marks the start of a steady-state range 1312. In a steady-state range 1312, the resistivity of the produced thin-film does not vary substantially with varying pulsed-DC frequencies. As illustrated, line 1302 has a steady-state 1312 that corresponds to a frequency range from 100 kHz to ~200 kHz. In some embodiments, at an inflection point 1314 the resistivity of the thin film begins to increase. As illustrated, the inflection point 1314 for line 1302 corresponds to a frequency of ~200 kHz. After the inflection point 1314, an increasing resistivity range 1316 may be present. In increasing resistivity range 1316, the resistivity of the produced thin film increases as frequency of the pulsed-DC increases. As illustrated, line 1302 has an increasing resistivity range 1316 that corresponds to a frequency of ~200 kHz to at least 300 kHz.

Figure 14:
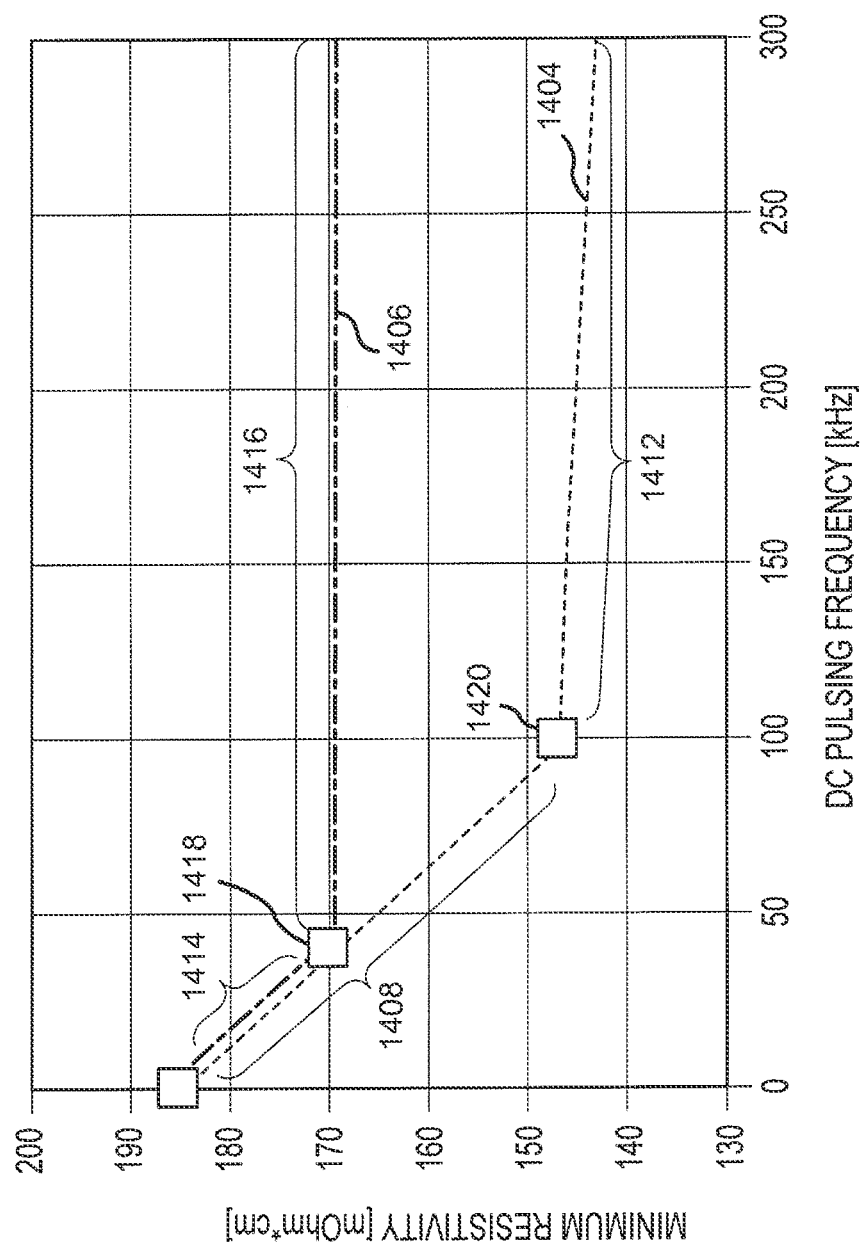
FIG. 14 illustrates the expected resistivity properties of thin films when a composite waveform 400 is applied to a cathode.

FIG. 14 illustrates the expected resistivity properties of thin films created when a composite waveform 1200 is applied to a cathode. The y-axis of the graph illustrates the minimum resistivity $\mu$Ohm*cm. The x-axis represents the frequency at which the DC pulse would be applied to a cathode of a sputtering deposition chamber. Line 1404 illustrates the resistivity of a thin-film that may be produced by applying an embodiment of a composite waveform 1200, i.e., an RF waveform superimposed on pulsed-DC waveform combined with reverse voltage limiting. Additionally, line 1406 illustrates the resistivity of a thin-film produced that may be produced by applying an alternative embodiment of a composite waveform 1200.

Line 604 may be understood as having two areas, a decreasing resistivity range 1408 and steady-state range 1412. Additionally, line 1406 may be understood as having two areas, a decreasing resistivity range 1414 and a steady-state range 1416. As illustrated, line 1404 has a decreasing resistivity range 1412 that is greater than the decreasing resistivity range 1414 of line 1406. In embodiments, this may be because the composite waveform 1200 that produced the results illustrated by line 1406 has a lower reverse voltage threshold than the composite waveform 1200 that produced the results illustrated by line 1404.

As illustrated, lines 1404 and lines 1406 have no increasing resistivity range. This may occur because the composite waveforms 1200 used to produce lines 1404 and 1408 have a reverse limiting voltage threshold. This reverse threshold may ensure that ions that strike the previously deposited material have a sufficiently low kinetic energy.

Figure 15:
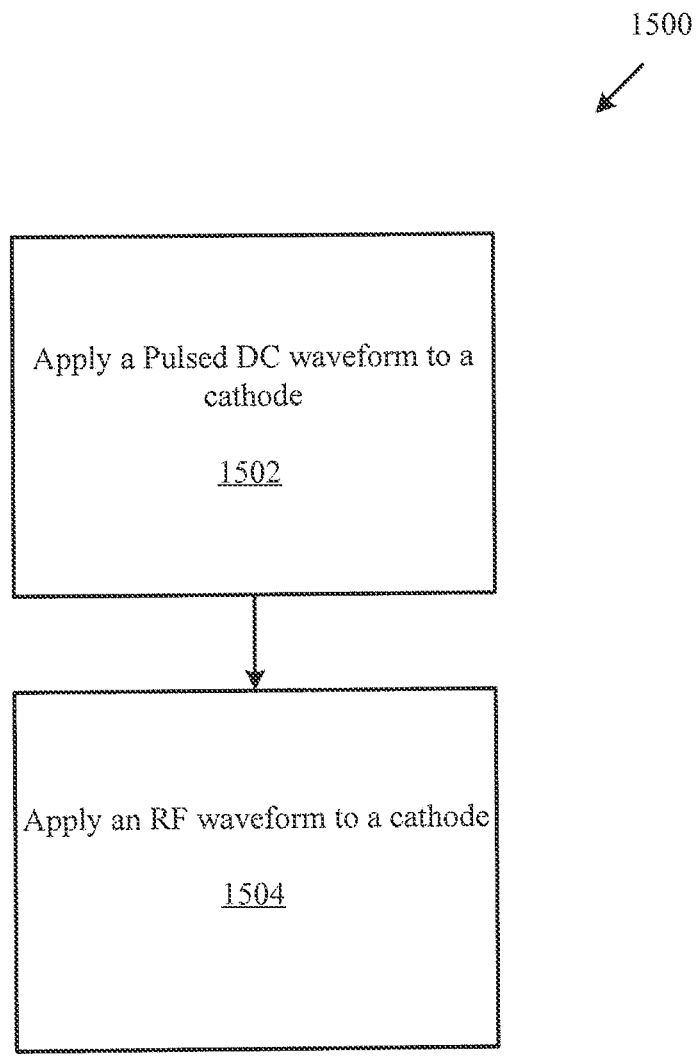
FIG. 15 illustrates a method of applying an RF waveform super positioned on a pulsed DC waveform combined with reverse voltage threshold to a cathode of a sputtering deposition process.

FIG. 15 illustrates a method 1500 of applying an RF waveform super positioned on a pulsed DC waveform combined with reverse voltage threshold to a cathode of a sputtering deposition process. The method 1500 includes an apply a pulsed DC waveform to a cathode operation 1502. The method 1500 also includes an apply an RF waveform to a cathode operation 1504.

As illustrated, method 1500 begins with apply a pulsed DC waveform to a cathode operation 1502. In other embodiments, the method 1500 begins with an apply an RF waveform to a cathode operation 1504. Still in other embodiments, the operations 1502 and 1504 may occur at the same time.

Figure 15A:
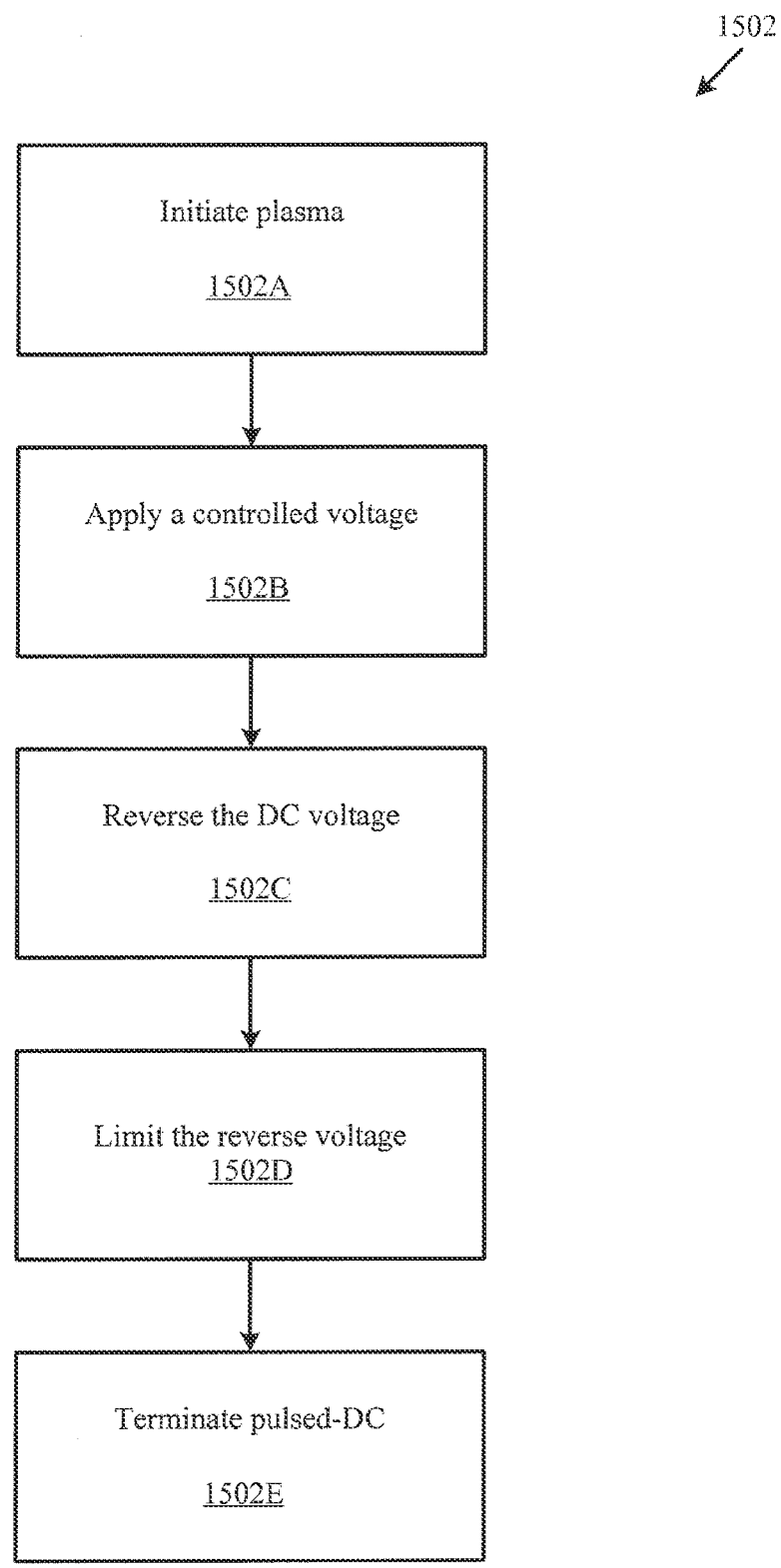
FIG. 15A illustrates the apply a pulsed DC waveform to a cathode operation.

FIG. 15A illustrates the apply a pulsed DC waveform to a cathode operation 1502. The applying a pulsed DC waveform operation 1502 includes an initiate plasma operation 1502A, apply a controlled voltage operation 1502B, a reverse the DC voltage operation 1502C, a limit the reverse voltage operation 1502D, and a terminate pulsed-DC operation 1502E.

The apply a DC waveform to a cathode operation 1502 begins with an initiate plasma operation 1502A. Initiate plasma operation 1502A may result in a negative voltage spike for some period of time. For example, the spike lasts for between 0.5 to 10 microseconds in embodiments. In other embodiments, there is no spike, and an initiate plasma operation 1502A merely marks the point at which a pulse DC waveform is first applied to a cathode.

The apply a DC waveform to a cathode operation next proceeds to an apply a controlled voltage operation 1502B to a cathode operation. This operation results in a DC being applied for some time period at a substantially fixed voltage. For example, a DC waveform may have a controlled voltage operation 1502B between −100V and −300V.

Next, operation 1502 proceeds to a reverse the DC voltage operation 1502C. In an embodiment, reverse the DC voltage operation 1502C causes the voltage to be reversed from negative to positive. As mentioned above, the reverse the DC voltage operation 1502C may be an active operation as shown or may be a natural result of the termination of the operation 1502B. In an embodiment where the original voltage was positive, the reverse the DC voltage operation 1502C causes the voltage to be reversed from positive to negative. In an embodiment, the reverse DC voltage operation 1502C causes the DC voltage to go to between +50 and +400V absent a limit the reverse voltage operation 1502D described below.

A limit the reverse voltage operation 1502D limits the degree to which the reverse the DC voltage operation 1502C can reverse the voltage applied to the cathode. In embodiments, the limit the reverse voltage operation 1502D causes the reverse voltage to be limited to one of the following voltages +50V, +60V, +70V, +80V, +90V, +100V, +110V, +120V, +130V, +140V, +150V, +160V, +170V, +180V, +190V, +200V, +210V, +220V, +230V, +240V, +250V, +260V, +270V, +280V, +290V, +300V, +310V, +320V, +330V, +340V, +350V, +360V, +370V, +380V, +390V, and +400V. A terminate pulsed-DC operation 1502E ends the application of the reverse voltage to a cathode. This may occur naturally as a final result of terminating operation 1502B.

The reverse voltage limiting operation 1502D is presented here as a separate step, although the reader will recognize that the reverse voltage operation 1502C, the limiting operation 1502D and the DC pulse termination operation 1502E may all occur at the same or substantially the same time and may be, in effect, a single operation. In an embodiment in which the reverse voltage is a transient effect caused by the termination of the DC pulse, the limiting operation 1502D is achieved by the simultaneous activation of reverse voltage limiting electronics that prevent the reverse voltage from exceeding the set threshold.

In embodiments where the target is non-metallic, the timed activation of the electronics prevents interference with the applied RF waveform or other desired transient elements of the waveform, which would be detrimentally affected if the limiting electronics were active at all times. In an alternative embodiment, although difficult in practice using currently available technology, the entire waveform may be controlled by software so that the exact desired waveform is delivered at the chamber without the need to rely on inherent properties of the hardware to intrinsically create some or all of the waveform (e.g., the reverse voltage).

Figure 15B:
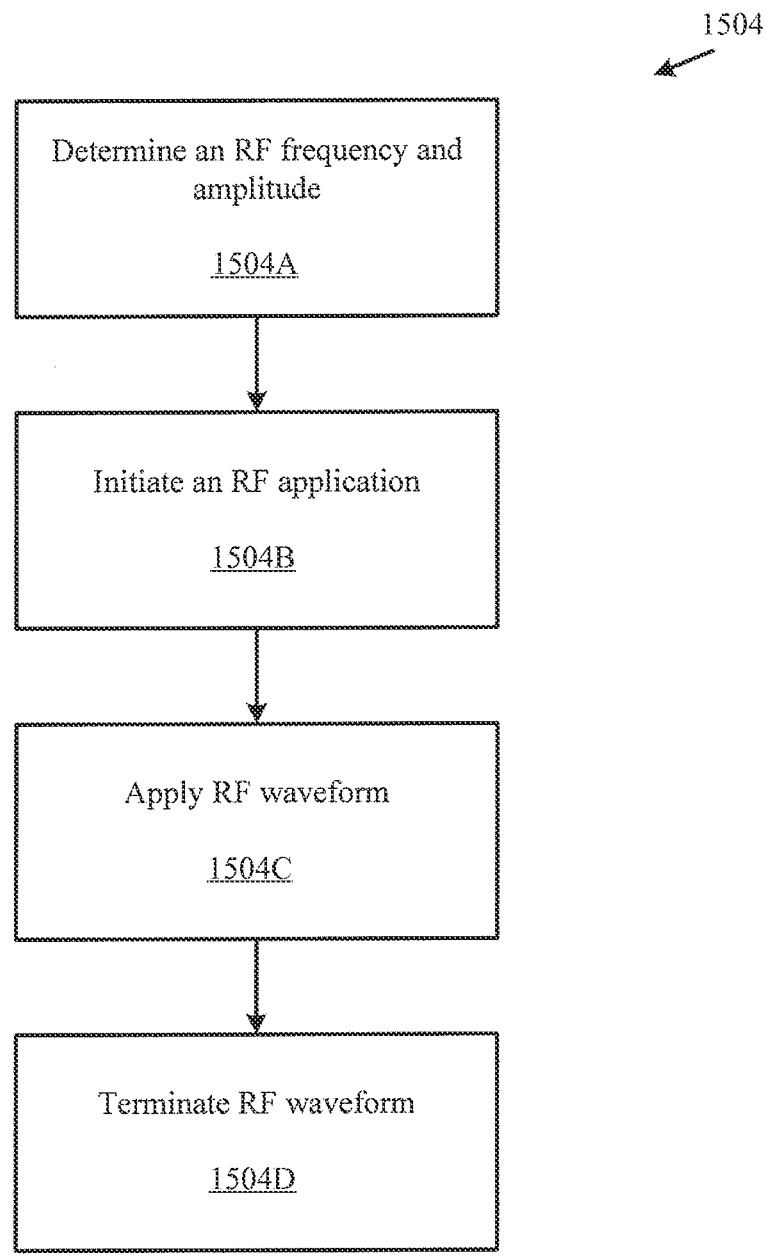
FIG. 15B illustrates an apply an RF waveform operation.

FIG. 15B illustrates an apply an RF waveform operation 1504. In an embodiment, the apply an RF waveform operation 1504 includes a determine an RF frequency and amplitude operation 1504A, an initiate an RF application 1504B, an apply an RF operation 1504C, and a terminate an RF application 1504D.

Apply an RF waveform operation 1504 begins with a determine an RF frequency and amplitude operation 1504A.

Next an initiate an RF application operation 1504B initiates the application of an RF waveform to a cathode. The application of the RF waveform to a cathode continues through apply an RF waveform operation 1504C. Apply an RF waveform operation 1504C may last for a duration of the apply a controlled voltage operation 1502B. Alternatively the apply the RF waveform operation 1504C may last for the entire duration of all cycles of pulsed-DC waveform.

A terminate an RF application operation 1504D stops the application of an RF waveform to a cathode. In embodiments, the terminate an RF application operation occurs before the limit the reverse voltage operation 1502D.

Figure 16:
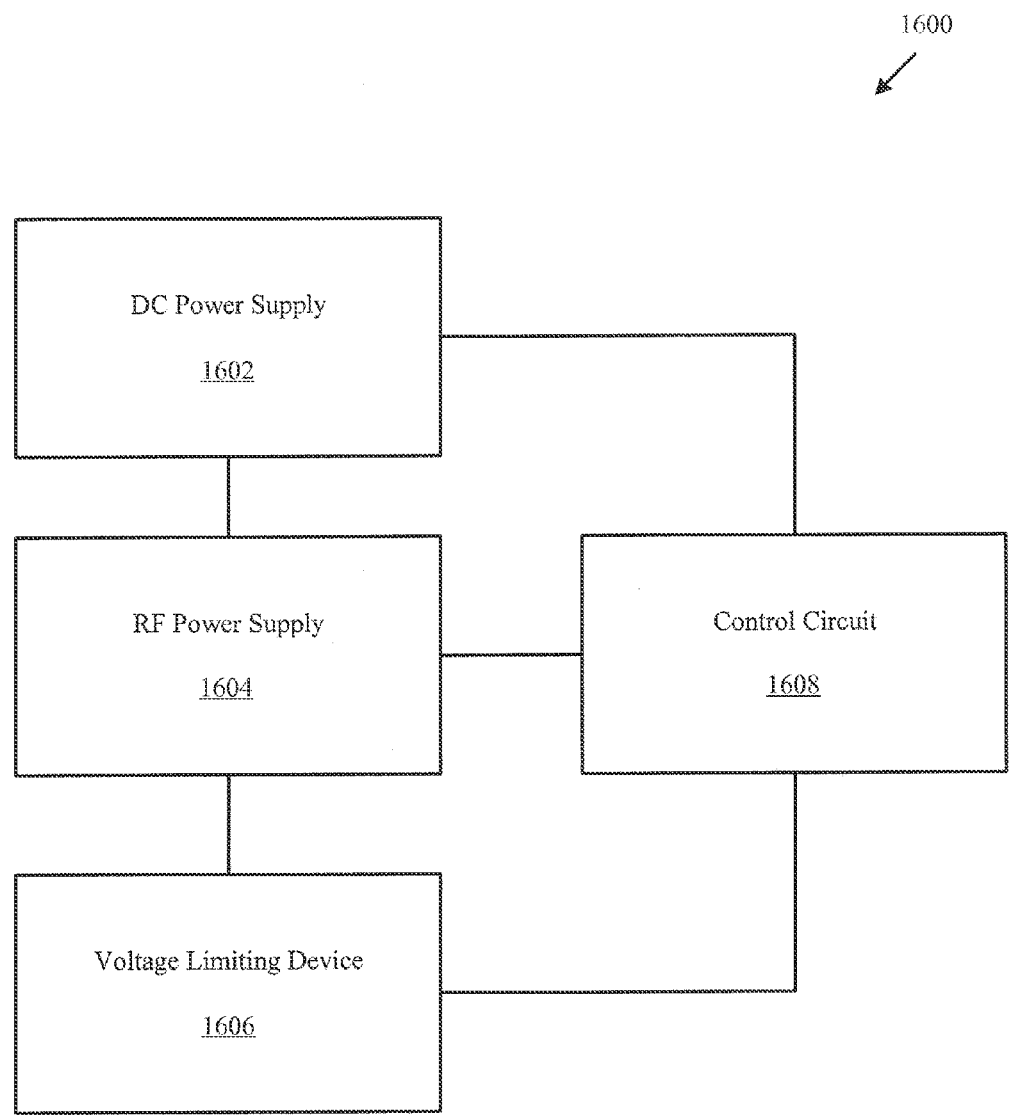
FIG. 16 illustrates a system to apply an RF and pulsed DC waveform combined with reverse voltage threshold to a cathode of a sputtering deposition process.

FIG. 16 illustrates a system to apply an RF and pulsed DC waveform combined with reverse voltage threshold to a cathode of a sputtering deposition process 1600. As illustrated, FIG. 16 includes a DC power supply 1602, an RF power supply 1604, a reverse voltage limiting device 1606, and a control circuit 1608. The DC power supply 1602 applies a pulsed-DC waveform 1602 to a cathode of a sputtering deposition chamber. The RF power supply 1604 applies an RF waveform 1104 to a cathode. A reverse voltage limiting device 1606 limits the reverse voltage of a pulsed-DC waveform 1102. The reverse voltage limiting device 1606 may include any suitable signal modification circuits such as capacitors, inductors, selected low-pass or band-pass filters or other electronics as needed to achieve the desired responsiveness and voltage limiting for the particular application. Additionally, a control circuit 1608 controls the interaction and timing of the DC power supply 1602, the RF power supply 1604, and the activation of the reverse voltage limiting device 1606. For example, the control circuit 1608 may ensure that the RF power supply 1604 turns off prior to the DC power supply 1602 applying a reverse DC voltage portion 1110 to a cathode of a sputtering process.

It will be clear that the systems and methods described herein are well adapted to attain the ends and advantages mentioned as well as those inherent therein. Those skilled in the art will recognize that the methods and systems within this specification may be implemented in many manners and as such is not to be limited by the foregoing exemplified embodiments and examples. In other words, functional elements being performed by a single or multiple components and individual functions can be distributed among different components. In this regard, any number of the features of the different embodiments described herein may be combined into one single embodiment and alternate embodiments having fewer than or more than all of the features herein described as possible.

While various embodiments have been described for purposes of this disclosure, various changes and modifications may be made which are well within the scope of the disclosed methods. Numerous other changes may be made which will readily suggest themselves to those skilled in the art and which are encompassed in the spirit of the disclosure.

What is claimed:

1. A method comprising:
    selecting polyethylene terephthalate as a substrate, wherein the substrate has a melting point of less than 250° C.;
    selecting one or more dielectric materials to be deposited onto the substrate;
    depositing, in a process chamber with an average temperature below 240° C., the one or more dielectric materials onto the substrate to form an infrared controlling thin film device, wherein the depositing occurs at rate greater than 50 angstroms per second using microwave energy chemical vapor deposition; and
    pulsing a microwave at a rate of 100 Hz during the depositing.

2. The method of claim 1, further wherein the infrared controlling thin film device has an average infrared reflectance that is above 85%, and has an average visible transmittance of above 85%.

3. The method of claim 1, further wherein the infrared controlling thin film device has an average infrared reflectance that is above 85%, and the device has an average visible transmittance of above 90%.

4. The method of claim 1, wherein the one or more dielectric materials are a transparent conductive oxide.

5. The method of claim 4, wherein the transparent conductive oxide is selected from the group consisting of: gallium doped zinc oxide (GZO), aluminum doped zinc oxide (AZO), Indium doped tin oxide (ITO), and fluorine doped tin oxide.

* * * * *